United States Patent
Hoang et al.

(10) Patent No.: US 10,602,612 B1
(45) Date of Patent: Mar. 24, 2020

(54) VERTICAL MODULE AND PERPENDICULAR PIN ARRAY INTERCONNECT FOR STACKED CIRCUIT BOARD STRUCTURE

(71) Applicant: Apple Inc., Cupertino, CA (US)

(72) Inventors: Lan H. Hoang, Los Gatos, CA (US); Takayoshi Katahira, San Jose, CA (US); Leilei Zhang, Sunnyvale, CA (US); Raghunandan R. Chaware, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/512,280

(22) Filed: Jul. 15, 2019

(51) Int. Cl.
*H05K 1/14* (2006.01)
*H05K 1/11* (2006.01)

(52) U.S. Cl.
CPC ............. *H05K 1/144* (2013.01); *H05K 1/117* (2013.01); *H05K 2201/041* (2013.01); *H05K 2201/10454* (2013.01)

(58) Field of Classification Search
CPC .. H05K 1/144; H05K 1/117; H05K 2201/041; H05K 2201/10454
USPC ........................................................ 174/250
See application file for complete search history.

(56) References Cited

U.S. PATENT DOCUMENTS

| | | | |
|---|---|---|---|
| 9,153,494 B2 | 10/2015 | Choi et al. | |
| 9,245,836 B2 | 1/2016 | Sadaka | |
| 9,601,463 B2 | 3/2017 | Yu et al. | |
| 10,356,903 B1 | 7/2019 | Chen et al. | |
| 2004/0264156 A1* | 12/2004 | Ajioka | H01L 23/552 361/818 |
| 2005/0168961 A1* | 8/2005 | Ono | H01L 23/5385 361/784 |
| 2013/0081866 A1 | 4/2013 | Furutani et al. | |
| 2014/0042604 A1 | 2/2014 | Jeon et al. | |
| 2014/0061866 A1 | 3/2014 | Lee | |
| 2014/0085850 A1 | 3/2014 | Li et al. | |
| 2014/0168908 A1* | 6/2014 | Chuang | H05K 1/0218 361/735 |
| 2015/0287672 A1 | 10/2015 | Yazdani | |
| 2016/0086930 A1 | 3/2016 | Koey et al. | |
| 2018/0338375 A1 | 11/2018 | Shi et al. | |
| 2019/0131241 A1 | 5/2019 | Jeng et al. | |

* cited by examiner

*Primary Examiner* — Sherman Ng
(74) *Attorney, Agent, or Firm* — Jaffery Watson Mendonsa & Hamilton LLP

(57) ABSTRACT

Stacked circuit board structures are described. In an embodiment, a plurality of vertical devices serves as electrical interconnections between the first circuit board and the second circuit board. In an embodiment, a plurality of vertical interconnects or pins serve as electrical interconnections between the first circuit board and the second circuit board. The vertical interconnects or pins may be arranged side-by-side with a plurality of vertical or horizontal devices.

16 Claims, 20 Drawing Sheets

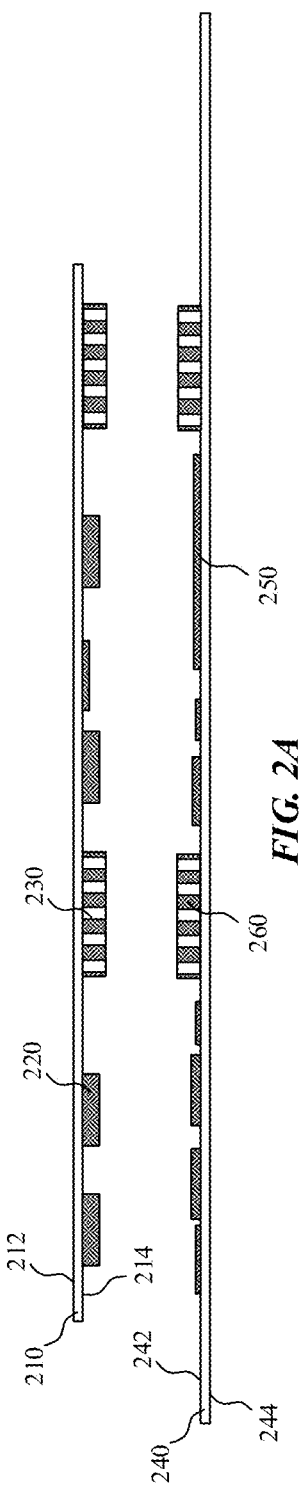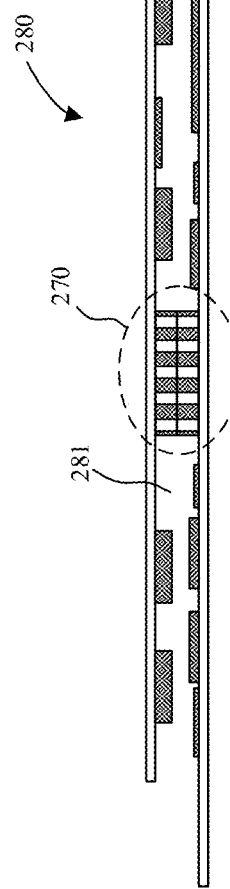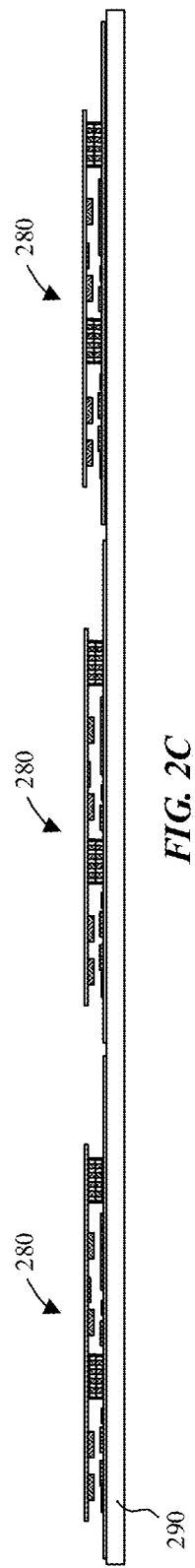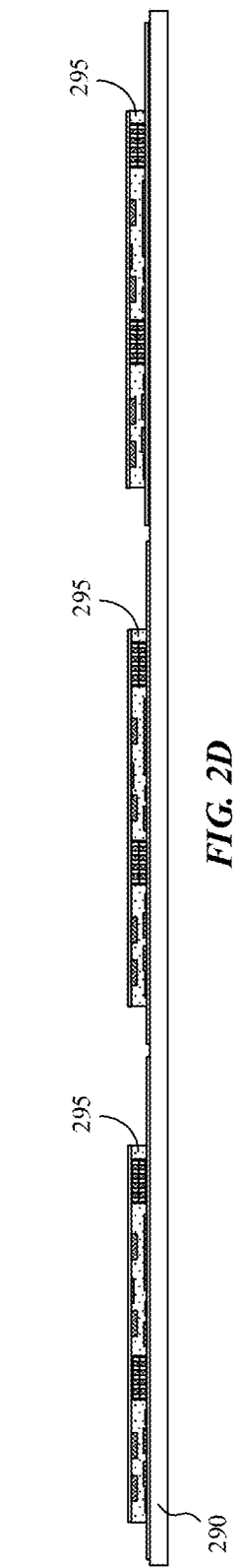
FIG. 2A
FIG. 2B
FIG. 2C
FIG. 2D

VERTICAL MODULE AND PERPENDICULAR PIN ARRAY INTERCONNECT FOR STACKED CIRCUIT BOARD STRUCTURE

BACKGROUND

Field

Embodiments described herein relate to electronic packaging, and more particularly to printed circuit board assembly.

Background Information

The trend in consumer electronics is to make products smaller, with the exception of display size, for a range of product categories including phones, computers, portable music players, earbuds, audio systems, etc. Hence there is a drive for minimization for all the parts inside these products.

The main logic board (MLB) is a common part in almost all of the consumer electronics. Industry has been working to utilize smaller and thinner dies, packages and components. The spacings between the components are also made smaller and smaller. Industry is also trying to add more and more smart functions in all the portable electronics including smart phones, watches, etc. These new functions require new hardware. To accomplish hardware like camera module, alerts, charging, batteries, biosensors, etc. the MLBs may become constrained to certain volume with restrictions on areas, heights, or shapes.

SUMMARY

Stacked circuit board structures are described in which a first and second circuit board are stacked on top of one another and electrically connected with a plurality of active or passive devices, which may provide both mechanical support to the stacked structure, as well as electrical interconnection between the circuit boards. The devices may be integrated horizontally or vertically in accordance with embodiments and may optionally be arranged side-by-side with a plurality of vertical interconnects. The devices and vertical interconnects may additionally be integrated within interposer structures in some embodiments.

In an embodiment, a stacked circuit board structure includes a plurality of vertical pins which serve as electrical interconnections between the first circuit board and the second circuit board. The plurality of vertical pins may be arranged with the various configurations of horizontal devices or vertical devices. Furthermore, the plurality of vertical interconnects may be vertical pins.

BRIEF DESCRIPTION OF THE DRAWINGS

FIGS. 2A-2E are cross-sectional side view illustrations of a sequence of assembling a stacked circuit board structure in accordance with an embodiment.

DETAILED DESCRIPTION

Figure 1:
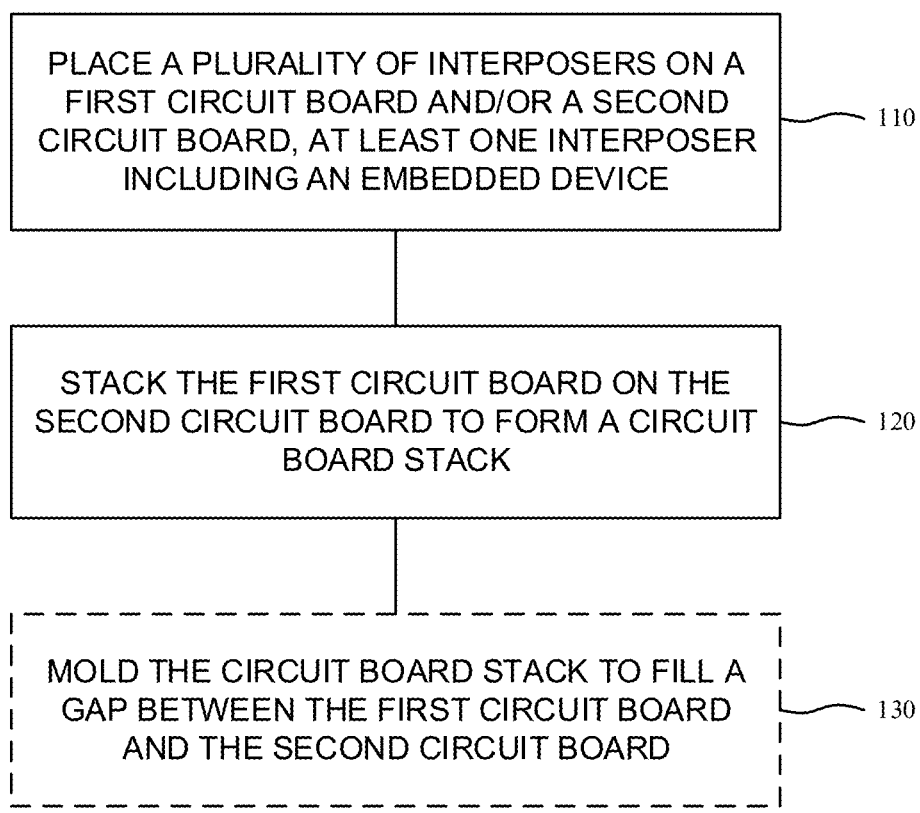
FIG. 1 is a flow chart illustrating a method of assembling a stacked circuit board structure in accordance with an embodiment.

Embodiments describe stacked circuit board structures in which opposing circuit boards are stacked on top of one another and interconnected with a vertical module and/or vertical pin arrays. For example, the vertical module may include active or passive devices and optionally vertical interconnects. The vertical module may optionally be an interposer, or an arrangement of devices and optionally vertical interconnects. In an embodiment, the vertical module is an arrangement of vertical devices, such as passive devices, to form a vertical passive module. The vertical module and vertical pin arrays may provide both mechanical support to the stacked structure, as well as electrical interconnection between the circuit boards. For example, the vertical interconnects and vertical pin arrays may be for signal and power transmission between the circuit boards. The integrated active or passive devices may optionally be arranged amongst vertical interconnects (e.g. vias, pins, etc.), and vice versa. Exemplary devices include integrated circuits, resistors, capacitors (e.g. electrostatic discharge (ESD) decoupling capacitors), inductors, etc.

In one aspect, integration of embedded devices can save space on the circuit boards. As a result, the overall x, y size for the system may be smaller compared to open face designs of traditional circuit board arrangements. Furthermore, the vertical modules and vertical pin arrays accordance with embodiments may facilitate higher I/O pitch, or circuit board miniaturization while also providing freedom of design by placement at any open space. Embodiments described herein may be applicable to a variety of circuit boards, such as printed circuit boards (PCBs) and main logic boards (MLBs).

A molding design with a molding compound, such as an epoxy molding compound (EMC), can additionally be included to fill the gap between the two circuit boards. For example, a film assisted transfer molding process may be able to fill gaps of several tens of microns. In some embodiments, this may allow for the elimination of underfilling the board components, which can require expensive underfill materials and tools. The molded design may also be mechanically robust, particularly compared to open face designs or hollow board stacks. Additionally, the molded structure may be water proof. Furthermore, due to stacked design, component layout on the circuit boards may be more flexible for improved signal integrity.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "over", "to", "between", "spanning" and "on" as used herein may refer to a relative position of one layer with respect to other layers. One layer "over", "spanning" or "on" another layer or bonded "to" or in "contact" with another layer may be directly in contact with the other layer or may have one or more intervening layers. One layer "between" layers may be directly in contact with the layers or may have one or more intervening layers.

Referring now to FIG. 1 a cross-sectional side view illustration is provided of a method of assembling a stacked circuit board structure in accordance with an embodiment. In interest of clarity and conciseness, the following discussion of FIG. 1 is made concurrently with the description of the sequence illustrated in FIG. 2A-2E. It is to be appreciated however, that embodiments are not so limited, and variations of structure and sequence are contemplated. For example, various structural and sequence variations are provided in FIGS. 3-18 that follow.

In accordance with embodiments, the illustrated processing sequences may begin with circuit boards that have been populated with components, and optionally interposers or vertical pin arrays, with surface mount (SMT) assembly. This may have been done at the panel level, followed by singulation of the populated circuit boards. In certain variations, the circuit boards can be populated on a single side or both sides, or also molded on a single side or both side, or not yet molded. Thus, the processing sequences described herein in accordance with embodiments may be compatible with a variety of different circuit board designs. These circuit boards may then be stacked and optionally molded, which can be performed at a re-constituted panel process, followed by singulation of stacked circuit boards. A final SMT assembly may be optionally be performed, before or after singulation, to add any additional desired components to the stacked circuit boards.

In an embodiment, at operation 110 a plurality of interposers 230, 260 is placed on a first circuit board 210 and/or a second circuit board 240. At least one of, a plurality of, or all of the interposers 230, 260 can include one or more embedded devices, such as an active device or more particularly a passive device. As shown in FIGS. 2A-2B, at operation 120 the first circuit board 210 is stacked on a second circuit board 240 to form a circuit board stack 280. The first circuit board 210 may include a first side 212 and a second side 214 opposite the first side, and one or more second side components 220 mounted on at least the second side 214 (e.g. bottom side) of the first circuit board 210. The second circuit board 240 may include a first side 242 and a second side 244 and one or more first side components 250 mounted on at least the first side 212 (e.g. top side) of the second circuit board 240. Components 220, 250 may be a variety of SMT circuit board components, such as packages (e.g. logic, memory, system on chip, etc.), transceivers, receivers, cameras, passives, etc. In accordance with embodiments, a gap 281 exists between the first circuit board 210 and the second circuit board 240, as well as the associated components as shown in FIG. 2B. Thus, the gap 281 is also between the components 220, 250 that overlap each other (e.g vertically, as opposed to laterally).

Figure 2E:
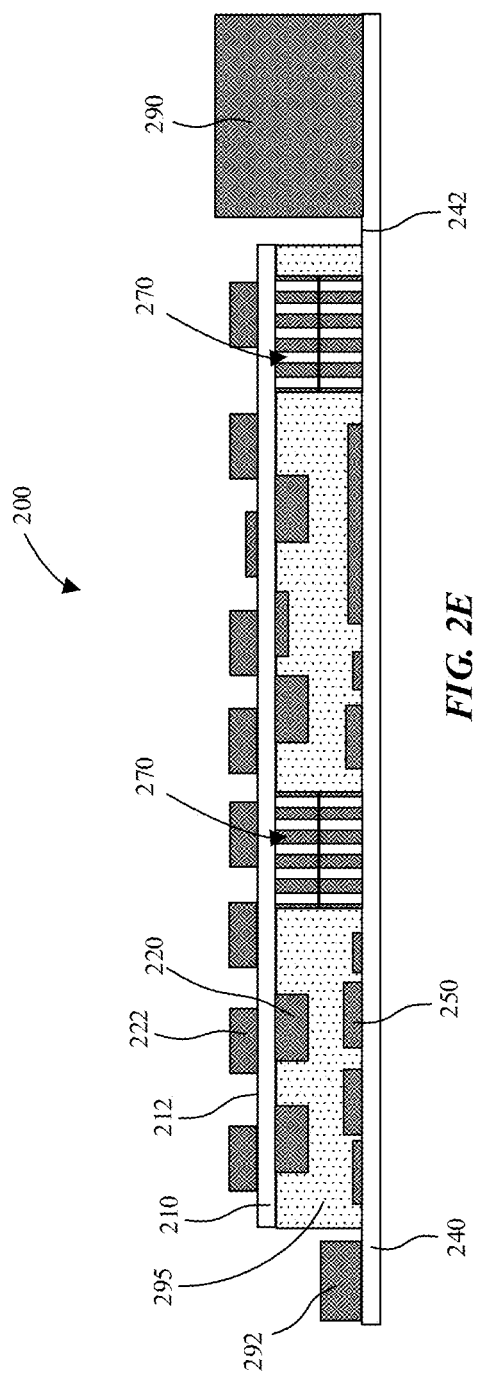
Figure 3:
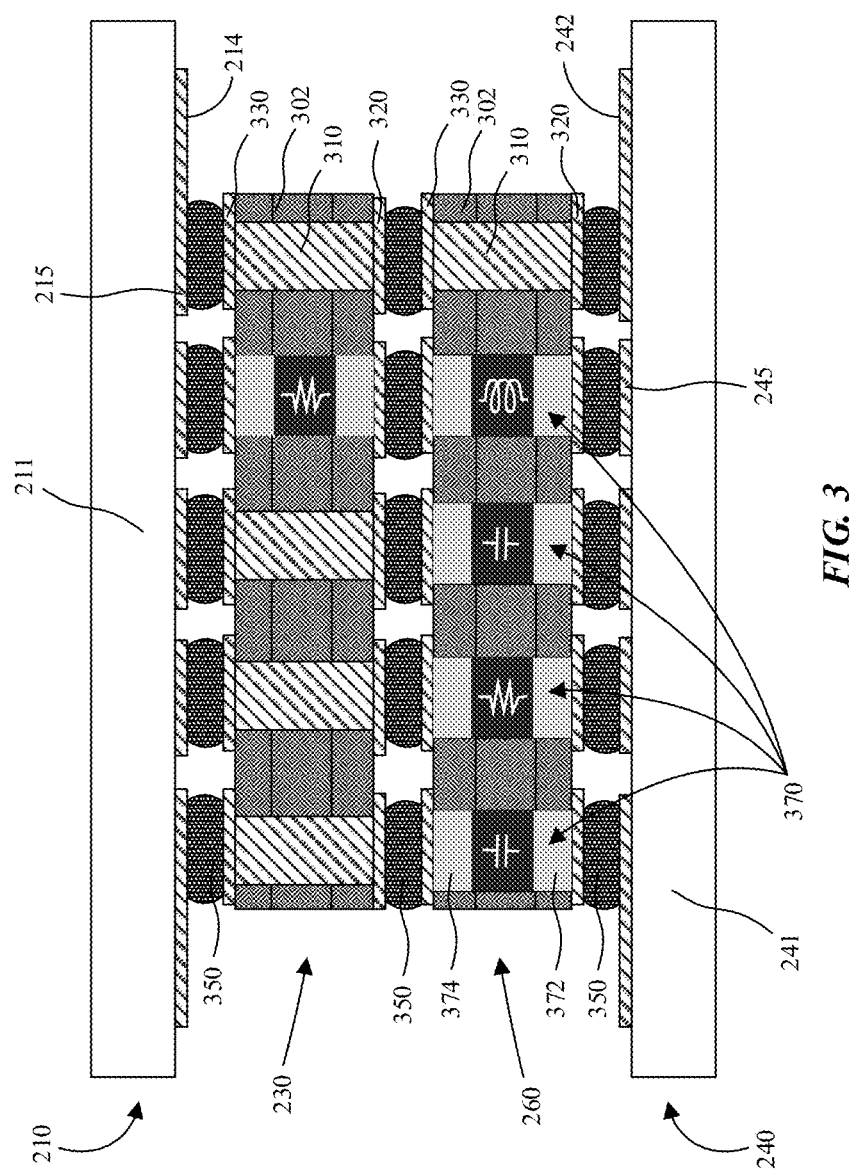
FIG. 3 is a schematic cross-sectional side view illustration of stacked interposers mounted between two circuit boards in accordance with an embodiment.

As shown in FIG. 2B and the close up illustration in FIG. 3, interposers 230, 260 can also be mounted on either or both of the circuit boards 210, 240 and extend between and connect the first circuit board 210 and the second circuit board 240. The connection may be physical, and may additionally be an electrical connection between the circuit boards. Thus, there may be a single interposer mounted on one of the circuit boards 210, 240 that connects the circuit boards 210, 240 after stacking. Alternatively, as illustrated, there may be an interposer mounted on each circuit board, and stacking the circuit boards includes stacking the interposers 230, 260 to form an interposer stack 270. The one or more interposers 230, 260 in accordance with embodiments are located laterally adjacent the one or more components 220, 250 on their respective circuit boards 210, 240.

The circuit boards 210, 240 can be substrates with one more layers of conductive traces or routing inside them. For example, the circuit boards 210, 240 may include a rigid substrate 211, 241 with conductive traces 215, 245 for attachment of various components, interposers, etc. Conductive traces 215, 245 may be contained wholly or partially within the rigid substrates 211, 241, and may also be formed on surfaces of the substrates 211, 241. In some configurations, a substantial portion of the conductive traces 215, 245 are contained within multiple metal layers in the substrates 211, 241, with limited routing of the conductive traces 215, 245 on top of the substrates 211, 241. In an embodiment, each interposer 230, 260 is bonded to a conductive trace 215, 245 on a substrate 211, 241 of a respective circuit board 210, 240. The substrates 211, 241 may be formed of a variety of materials, including traditional substrates such as FR-2 (a phenolic paper impregnated with resin), FR-4 (a woven fiberglass impregnate with resin), ABF (Ajinomoto Build-up Film) metal or metal core substrates, silicon core substrates, ceramics, polymers, etc. In some embodiments, the substrates may be flexible. Conductive traces 215, 245 may be formed of suitable materials, such as copper, etc. In an embodiment, the first conductive traces 215 additionally electrically connect the one or more second side components 220 mounted on the second side 214 of the first circuit board 210, and the second conductive traces 245 additionally electrically connect the one or more first side components 250 mounted on the first side 242 of the second circuit board 240.

Still referring to FIG. 3, the one or more components 220, 250 and one or more interposers 230, 260 may be mounted on their corresponding circuit boards using SMT techniques such as flip chip, with solder bumps 350. Alternative techniques may additionally be used, including conductive films, pins, wire bonding, etc. In the embodiment illustrated, the stacked interposers 230, 260 are bonded to one another. In application where the interposers 230, 260 provide primarily structural support, any suitable bonding technique may be used. Where the interposers 230, 260 additionally provide electrical connection and embedded devices, the bonding technique may support the electrical connections and embedded devices. For example, conductive pastes, films, and solder bumps 350 may be suitable bonding methods. In order to facilitate electrical connections the interposers 230, 260 may include one or more vertical interconnects 310, such as vias, extending from a bottom side to a top side of the interposers. The vertical interconnects 310 may be contained within one or more layers of insulating material(s) 302. Thus, interposers 230, 260 are not limited to configurations with through vias, and vertical interconnects 310 may be formed in multiple metal layers and layers of insulating material 302. The interposers 230, 260 may optionally include top side routing 330 or bottom side routing 320 to facilitate electrical connections.

As shown in FIG. 3, the interposers 230, 260 may include one or more embedded devices 370. In an embodiment, the embedded devices are arranged among, and pitch-matched with the vertical interconnects 310. As shown, the embedded devices 370 may have contacts 372, 374 for electrical connection. The embedded devices 370 may be sized similarly as the vertical interconnects 310. Exemplary embedded devices 370 illustrated include capacitors, resistors, inductors as exemplary passive devices, though embodiments are not so limited.

Referring now to FIG. 2C the circuit board stack 280 can optionally be placed onto a carrier substrate 290. This may be performed at the panel level, where a plurality of circuit board stacks 280 are placed on the carrier substrate 290. A variety of carrier substrates maybe suitable such as glass or metal carriers. Placement may be aided by the addition of an adhesive tape layer. The carrier substrate 290 may be a rigid substrate to support handling, and subsequent molding and singulation operations.

The circuit board stack(s) 280 may then may optionally be molded at operation 130 to fill the gap 281 between the first circuit board 210 and the second circuit board 240 with a molding compound 295. As shown in FIG. 2D, the molding operation may be performed at the panel level, with a plurality of molding cavities corresponding to the plurality of circuit board stacks 280. In an embodiment, the molding operation is a film assisted transfer molding process. Such a process may be capable of filling gaps of several tens of microns. In one aspect, this may allow for the omission of underfill materials for any of the components 220, 250 or interposers 230, 260. The circuit board stack may then be singulated at operation 140. Singulating in accordance with embodiments may cut through only one of the circuit boards (e.g. second circuit board 240), or through both circuit boards 210, 240 and the molding compound 295 in the gap 281.

In accordance with embodiments, additional processing and SMT assembly of various components can be performed before or after singulation. FIG. 2E is a schematic cross-sectional side view illustration of a singulated system-in-package (SiP) stacked circuit board structure 200 in accordance with an embodiment. As shown in the singulated structure the components 220 overlap components 250. Additionally, the gap between the circuit boards 210, 240 and additionally between the components 220, 250 is filled with the molding compound 295. In accordance with embodiments, the first circuit board 210 includes a plurality of interposers 230 laterally adjacent to the one or more components 220 on the first circuit board, and the second circuit board 240 includes a plurality of interposers 260 laterally adjacent to the one or more components 250 on the second circuit board, and stacking the first circuit board on the second circuit board includes bonding the first plurality of interposers to the second plurality of interposers to form interposer stacks 270.

In accordance with embodiments, the final surface mount operation can optionally place components 222 on the first side 212 of the first circuit board 210, and/or place components 290, 292 on the first side 242 of the second circuit board 240. As shown, second circuit board 240 may have more area (e.g. increased length or width) than the first circuit board 210 to accommodate additional components 290, 292. In other embodiments, the sequence of final surface mount of components and singulation may be reversed.

Figure 4:
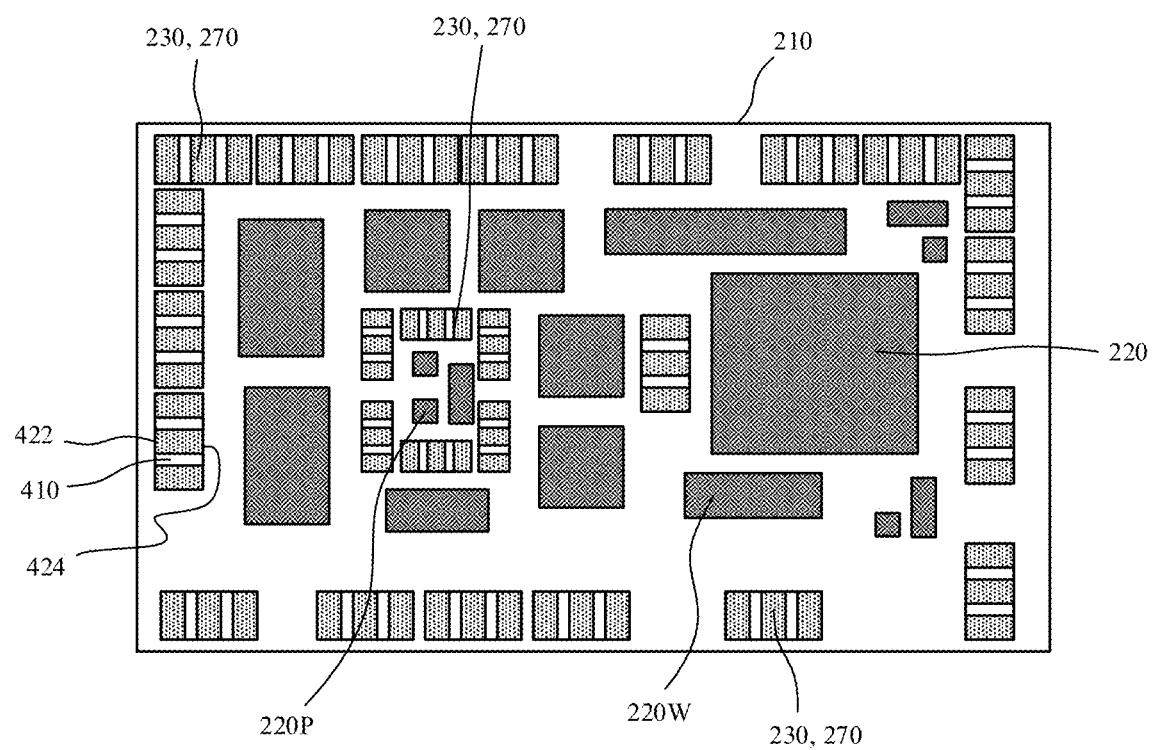
FIG. 4 is a schematic top layout view of circuit board components and interposers on a circuit board in accordance with embodiments.

FIG. 4 is a schematic top layout view of circuit board components and interposers in a system-in-package in accordance with embodiments. In interest of clarity, the schematic top layout view of FIG. 4 is made with regard to the components 220 and interposers 230 relative to a single circuit board 210 within the circuit board stack.

The interposers in accordance with embodiments may also be utilized to provide shielding, such as electromechanical interference (EMI) shielding. Thus, the interposers may be arranged in a variety of different ways. In some embodiments, the interposers are dispersed to provide mechanical support or electrical connections at specified locations. The interposers may be spaced apart, or closely together. When utilized for EMI shielding the interposers may be arranged closely together, and may surround one or more components. As shown in FIG. 4, a plurality of the interposers 230/270 may be arranged laterally around one or more of the components 220 (as well as components 250) in a configuration where the interposers 230/270 are arranged adjacent a periphery of one of the circuit boards 210 (or 240). This may be a uniform configuration entirely around the periphery of the circuit board(s), or a non-uniform arrangement where denser spacing is placed nearer specific components, and wider spacing may be allowed nearer other components. In another embodiment also illustrated in FIG. 4, a plurality of the interposers 230/270 may be arranged in a smaller scale, and among the components 220, yet surround one or more specific components 220. In both examples, the interposers 230/270 may surround, or be more densely arranged (spacing between), a subsystem of specific passive components 220P in order to shield them from other components, such as wireless components 220W outside the subsystem within the stacked system-in-package, or outside the system-in-package.

In some embodiments, while a dense arrangement of interposers may be provided, this may potentially affect flow of the molding compound during the molding operation. Thus, the interposers 230, 260 may optionally include lateral tunnels 410 that extend from a laterally exterior side 422 of the interposer to a laterally interior side 424 of the interposer, through which the molding compound can flow during molding.

In an embodiment, molding the circuit board stack 280 includes flowing a molding compound through lateral tunnels 410 of a plurality of interposers 230 and/or 260 connecting the bottom side of the first circuit board 210 to the top side of the second circuit board 240, where the plurality of interposers 230 and/or 260 are laterally adjacent to the one or more components 220 on the first circuit board 210 and the one or more components 250 on the second circuit board 240.

In accordance with some embodiments, a stacked circuit board structure includes a first circuit board 210 having a first side 212 and a second side 241 opposite the first side 212. A first plurality of components 220 placed on the second side 214 of the first circuit board 210. The stacked circuit board structure additionally includes a second circuit board 240 having a first side 242 and a second side 244 opposite the first side 242, where first side 242 of the second circuit board 240 faces the second side 241 of the first circuit board 210. A second plurality of components 250 are placed on the first side 242 of the second circuit board 240. In accordance with embodiments, a plurality of vertical devices 370, each of a same height, serve as electrical interconnections between the first circuit board 210 and the second circuit board 240. As shown, the contacts 372, 374 are arranged vertically in the vertical devices 370. Exemplary vertical devices 370 include active devices such as integrated circuits or more particularly, passive devices such as resistors, capacitors (e.g. electrostatic discharge (ESD) decoupling capacitors), inductors, etc. The vertical devices 370 in accordance with embodiments may simultaneously function as vertical interconnection, circuitry, and as discrete devices.

The plurality of vertical devices 370 may be part of an interposer (e.g. 230, 260) between the first circuit board 210 and the second circuit board 240. The interposer 230, 260 may additionally include a plurality of vertical interconnects 310 and one or more insulating layers 302 laterally surrounding both the plurality of vertical devices 370 and the plurality of vertical interconnects 310. The plurality of vertical devices 370 may be arranged side-by-side with the plurality of vertical interconnects 310. In an embodiment, the plurality of vertical devices 370 may be arranged with a same pitch as the plurality of vertical interconnects and may have a same size and shape as the plurality of vertical interconnects 310. In some embodiments, one or more vertical interconnects 310 may be "dummy" devices, such as zero ohm resistors.

In accordance with embodiments, the stacked circuit board structure may or may not be filled with a molding compound. In one configuration, a gap 281 (see FIG. 2B) exists first circuit board 210 and the second circuit board 240. In an embodiment, a molding compound 295 (see FIG. 2E) fills the gap between the first circuit board 210 and the second circuit board 240 and laterally surrounds the interposer 230, 260 (or stacked interposers 230, 260). In another embodiment, an open space fills the gap 281 between the first circuit board 210 and the second circuit board 240 and laterally surrounds the interposer 230, 260 (or stacked interposers 230, 260).

The vertical interconnects 310 may be formed and integrated in a variety of different manners. In an embodiment, the vertical interconnects 310 are formed using a deposition (e.g. plating) technique along with formation of the one or more insulator layers 302. For example, the vertical interconnects 310 may be vias or pillars. In an embodiment, the vertical interconnects 310 are stacked vias. In an embodiment, the vertical interconnects 310 are discrete vertical pins. For example, these may be integrated using a bonding technique, such as thermal compression bonding (TCB) using solder. In an embodiment, the one or more insulator layers 302 includes a single molding compound layer that laterally surrounds the plurality of vertical interconnects 310 and the plurality of vertical devices 370.

In an embodiment, the interposer of the stacked circuit board structure is a first interposer 260 bonded to the second side of the first circuit board 210. As illustrated in exemplary FIG. 3, the stacked circuit board structure additionally includes a second interposer 260 bonded to the first side of the second circuit board 260, where the first interposer 230 is stacked on top of the second interposer 260, and the first and second interposers electrically connect the first circuit board to the second circuit board. The second interposer 260 may be similar to the first interposer 230, and may include a second plurality of vertical devices 370, each of a same height, which serve as electrical interconnections between the first circuit board and the second circuit board, and a second plurality of vertical interconnects 310, where the second plurality of vertical devices 370 are arranged side-by-side with the second plurality of vertical interconnects 310.

While the embodiments described and illustrated thus far have featured devices 370 arranged vertically, embodiments are not so limited, and may incorporate horizontally arranged devices 370. In some embodiments, a stacked circuit board structure includes a first circuit board having a first side and a second side opposite the first side. A first plurality of components is placed on the second side of the first circuit board. The stacked circuit board structure additionally includes a second circuit board having a first side and a second side opposite the first side, where the first side of the second circuit board faces the second side of the first circuit board, and a second plurality of components are placed on the first side of the second circuit board. In accordance with embodiments, a plurality of horizontal devices and a plurality of vertical interconnects may be arranged side-by side between the first circuit board and the second circuit board, where the plurality of vertical interconnects electrically connect the first circuit board and the second circuit board. In some embodiment, the plurality of horizontal devices and the plurality of vertical interconnects are part of an interposer between the first circuit board and the second circuit board. In the following description of FIGS. 5-10 various stacked circuit board structure embodiments are described and illustrated as including horizontal devices. While various configurations are described and illustrated separately, it is understood that many features may be combined in a single embodiment.

Figure 5:
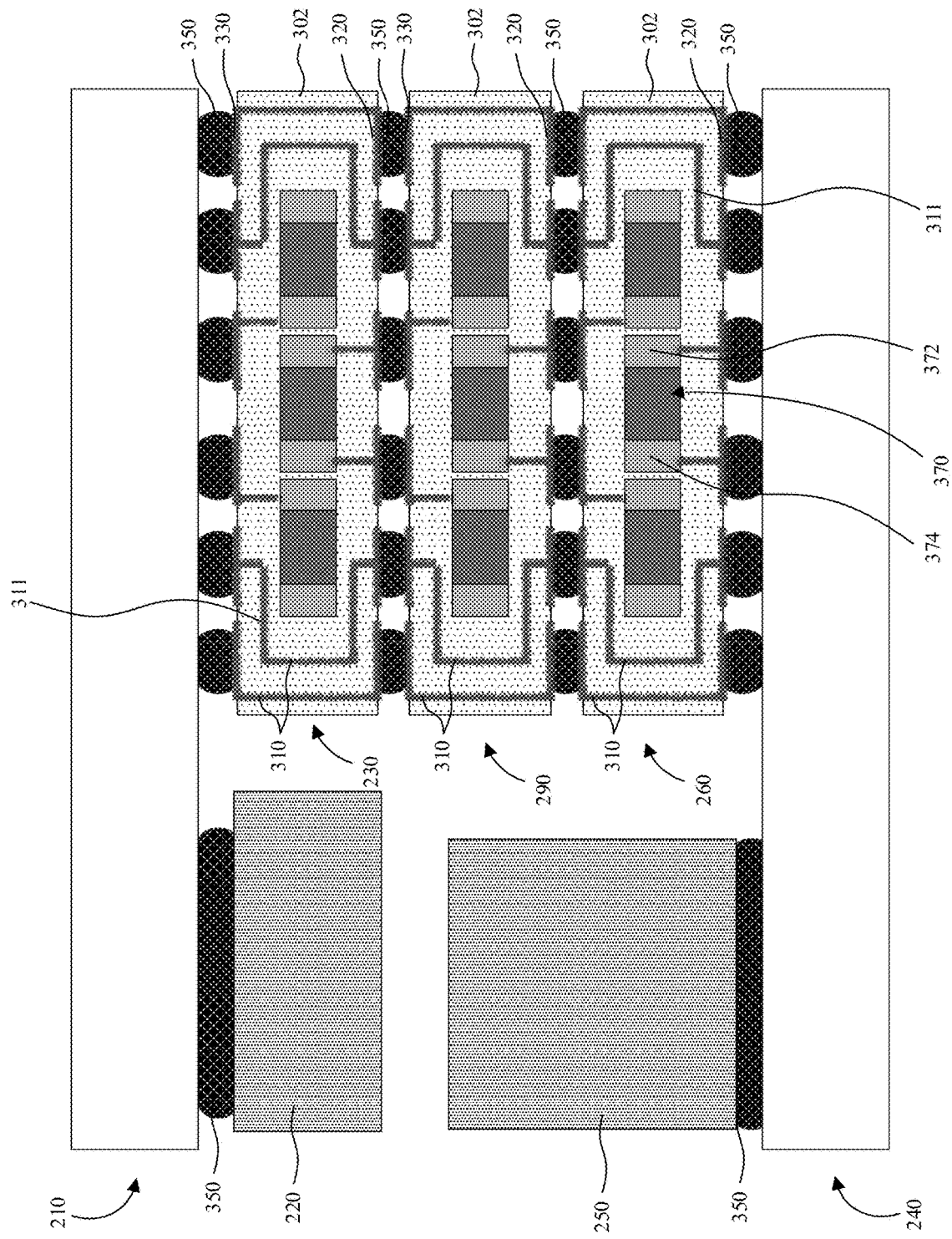
FIG. 5 is a schematic cross-sectional side view illustration of stacked interposers mounted between two circuit boards in accordance with an embodiment.

FIG. 5 is a schematic cross-sectional side view illustration of stacked interposers mounted between two circuit boards in accordance with an embodiment. The embodiment illustrated in FIG. 5 differs from the structure illustrated in FIG. 3 in several respects. Initially, the embodiment illustrated in FIG. 3 includes a plurality of vertical devices 370, in which contacts 372, 374 are arranged vertically. The embodiment illustrated in FIG. 4 includes a plurality of horizontal devices 370, in which contacts 372, 374 are arranged horizontally. Additionally, multiple stacked interposers 260, 290, 230 are illustrated as opposed to two stacked interposers, though this configuration is for illustrative purposes, and single interposer or additional interposers can be combined in either illustration. Similar to the embodiment illustrated in FIG. 3, the horizontal devices 370 may be embedded in one more insulating layer(s) 302, which may also include electrical routing, including or more vertical interconnects 310, such as vias, pillars, or pins, as well as horizontal routing 311 where required. In the embodiment illustrated, the interposers 260, 290, 230 are stacked and bonded using solder bumps 350.

The interposers 20, 290, 230 may each include one or more insulating layers 302, which can be formed of a variety of materials, including oxides, nitrides, polymers, and molding compound. Horizontal routing 311 may be metal lines for example. Vertical interconnects 310 may be any combination of vias, pillars, and pins. Depending upon routing, vertical interconnects 310 may have different heights, and may extend through one or more, or all, insulating layers 302.

In an embodiment, the interposer 260, 290, 230 of the stacked circuit board structure includes one or more insulating layers 302 laterally surrounding both the plurality of horizontal devices 370 and the plurality of vertical interconnects 310. In an embodiment, the interposer 260, 290, 23 is a first interposer 230 bonded to the second side of first circuit board 210. In an embodiment, a second interposer 260 is bonded to the first side of the second circuit board 240, where the first interposer 230 is stacked on top of the second interposer 260, and the first and second interposers electrically connect the first circuit board to the second circuit board. As illustrated in FIG. 5, one or more intermediate interposers 290 can be stacked between the first interposer and the second interposer.

Figure 6:
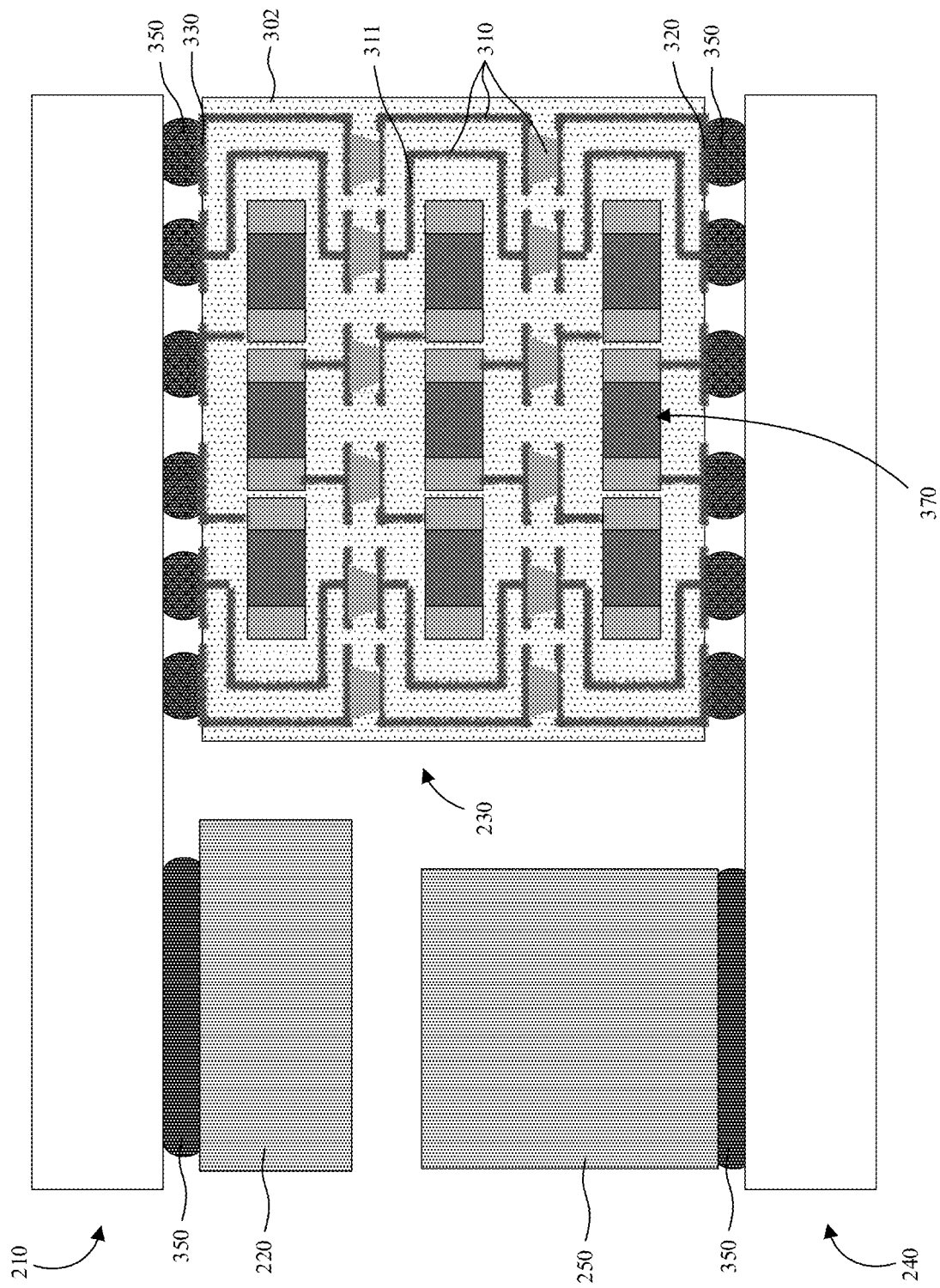
FIG. 6 is a schematic cross-sectional side view illustration of a single interposer mounted between two circuit boards in accordance with an embodiment.

FIG. 6 is a schematic cross-sectional side view illustration of a single interposer 230 mounted between two circuit boards in accordance with an embodiment. The embodiment illustrated in FIG. 6 is similar to that illustrated in FIG. 5, with a difference being that multiple levels of horizontal devices 370 are embedded in a single interposer 230 that is bonded to both the first circuit board 210 and second circuit board 240 with solder bumps 350.

Figure 7:
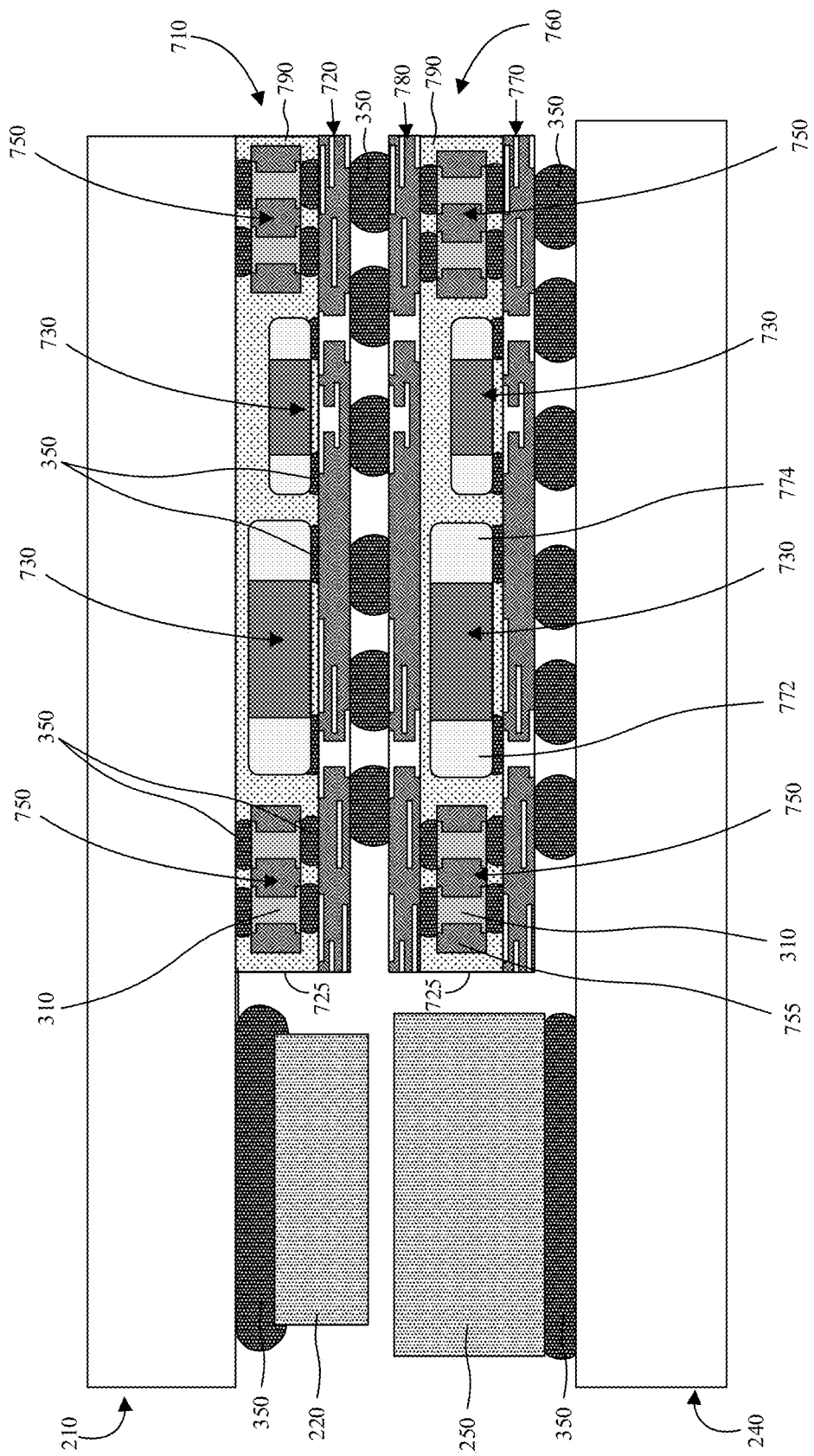
FIG. 7 is a schematic cross-sectional side view of a stacked interposers including embedded devices in accordance with an embodiment.

FIG. 7 is a schematic cross-sectional side view of a stacked interposers including embedded devices in accordance with an embodiment. The illustrated embodiment includes first interposer 710 bonded to the first circuit board 210 with solder bumps 350, and a second interposer 760 bonded to the second circuit board 240 with solder bumps 350. The first and second interposers 710, 760 may additionally be bonded together with solder bumps 350. Both interposers 710, 760 may include one or more horizontal devices 730 and vertical interconnects 310 side-by-side with the horizontal devices 730. The vertical interconnects may optionally be encapsulated with local interposers 750. For example, a local interposer 750 may be discrete components including the vertical interconnects 310 embedded in an insulation material 755 (e.g. organic or inorganic interposer materials such as glass or laminates, molding compound, etc.). Thus, each local interposer 750 may function as a vertical interconnection between a circuit board and another interposer board. Each interposer 710, 760 may include one or more redistribution layers (RDLs) 720, 770, 780 that includes one or more dielectric layers and routing layers to connect with the vertical interconnects 310 and horizontal devices 730. As illustrated, the local interposers 750 may allow for reduced pitch of vertical interconnections. For example, the pitch of the vertical interconnects 310 in the local interposers may be less than other vertical interconnection routing in the interposers 710, 760, including within the RDLs. Additionally, solder bump 350 pitch and volume/size may be less where bonded to the local interposers 750, than for the solder bumps 350 used to bonded interposers 710, 760 together and interposer 760 to the second circuit board 240. Where a local interposer 750 is used to bond directly to a circuit board (e.g. first circuit board 210), the pitch and volume/size may likewise be reduced to facilitate high density connections.

In the embodiment illustrated, the horizontal devices 730 and vertical interconnects 310 (or local interposers 750) may be encapsulated in a molding compound 790 that completely laterally surrounds each of the horizontal devices and vertical interconnects 310 (or local interposers 750, as illustrated). Each interposer 710, 760 may include lateral sidewalls 725 spanning the molding compound 790 and one or more RDL(s). The local interposers 750 and horizontal devices 730 may be bonded to a corresponding RDL with solder bumps 350, or the corresponding RDL may be formed directly on the local interposers 750 and horizontal devices 730 without solder. In accordance with embodiments, the horizontal devices 730 may be completely encapsulated by the molding compound 790 and corresponding RDL(s).

The horizontal devices 730 illustrated in FIG. 7 may additionally be surface mounted with solder bumps 350. Thus, the devices 730 may be placed onto a corresponding RDL 720, 770. This differs from a structure in which the devices 730 are placed first, followed by addition of the connecting RDL afterward. In such a case, special copper terminals can be present to facilitate the via contact. In accordance with embodiment, such as that illustrated in FIG. 7 as well as other illustrated embodiments, a SMT assembled device 730 (horizontal or vertical) may need not have specialized copper contacts 772, 774 (terminals).

In an embodiment, the stacked circuit board structure includes a local interposer 750 embedded in one of the first and second interposers (e.g. first interposer 790), where the local interposer is a discrete component and includes a portion of the plurality of vertical interconnects 310. The local interposer 750 may provide vertical interconnection between the one of the first and second circuit boards (e.g. first circuit board 210) to another of the first and second interposers (e.g. second interposer 760). In the embodiment illustrated in FIG. 7, a local interposer 750 is bonded directly to the one of the first and second circuit boards (e.g. first circuit board 210), and the other of the first and second interposers (e.g. second interposer 760) is bonded to another of the first and second circuit boards (e.g. second circuit board 240), where the local interposer 750 is bonded to the one of the first and second circuit boards (e.g. the first circuit board 210) with a smaller bump pitch than the other of the first and second interposers (e.g. second interposer 760) is bonded to the other of the first and second circuit boards (e.g. second circuit board 240). As shown, pitch and size/volume of the solder bumps 350 used to bond the local interposer 750 is smaller.

Figure 8:
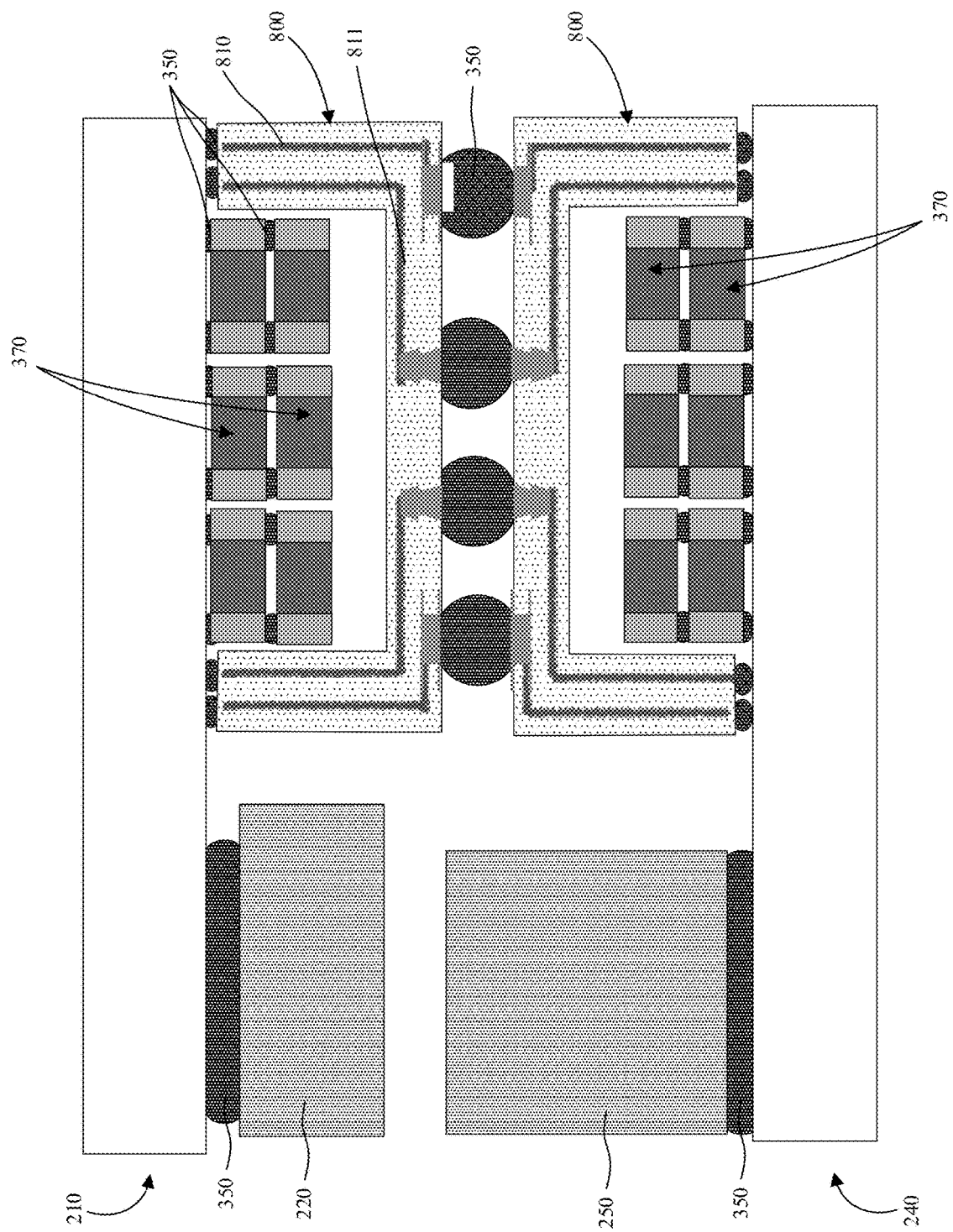
FIG. 8 is a schematic cross-sectional side view of a stacked fanout lid interposers in accordance with an embodiment.

FIG. 8 is a schematic cross-sectional side view of a stacked fanout lid interposers in accordance with an embodiment. The embodiment illustrated in FIG. 8 differs from other embodiments in that the plurality of horizontal devices 370 is located inside an opening in the corresponding fanout lid interposers 800, and the plurality of vertical interconnects 810 is arranged within sidewalls of the fanout lids. In the embodiment illustrated, a fanout lid interposer 800 is bonded to a corresponding circuit board 210, 240 with solder bumps 350, and horizontal devices 370 are bonded to the corresponding circuit board 210, 240 with solder bumps 350. Additionally, horizontal devices 370 may be stacked on top of one another and bonded with solder bumps 350. Where multiple fanout lid interposers 800 are used, they may be stacked on top of one another and bonded using solder bumps 350, which may have a larger pitch and volume/size.

The fanout lid interposers 800 in accordance with embodiments may include vertical interconnects 810 and horizontal routing 811 as required. For example, horizontal routing 811 may be located on the roof/top of the fanout lid interposers 800 for fanout routing to accommodate the larger pitch and volume/size of the solder bumps 350 used to bond stacked fanout lid interposers 800. The fanout lid interposers 800 may be formed of a variety of suitable materials including PCB materials (e.g. laminates) and glass, with metallization (e.g. copper, aluminum) used for the vertical interconnects and horizontal routing materials.

Figure 9:
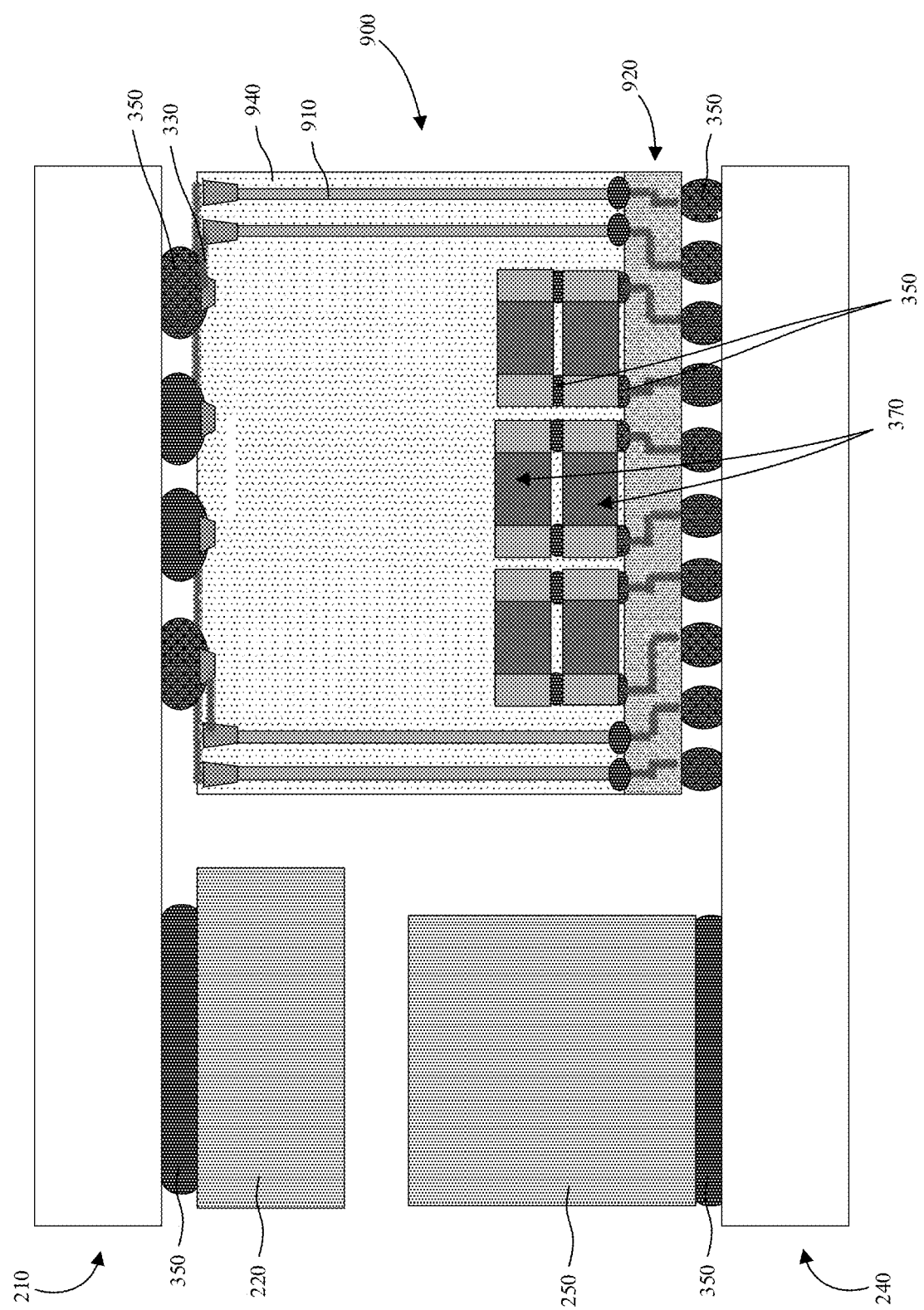
FIG. 9 is a schematic cross-sectional side view of an interposer with embedded devices and tall pillars in accordance with an embodiment.
Figure 10:
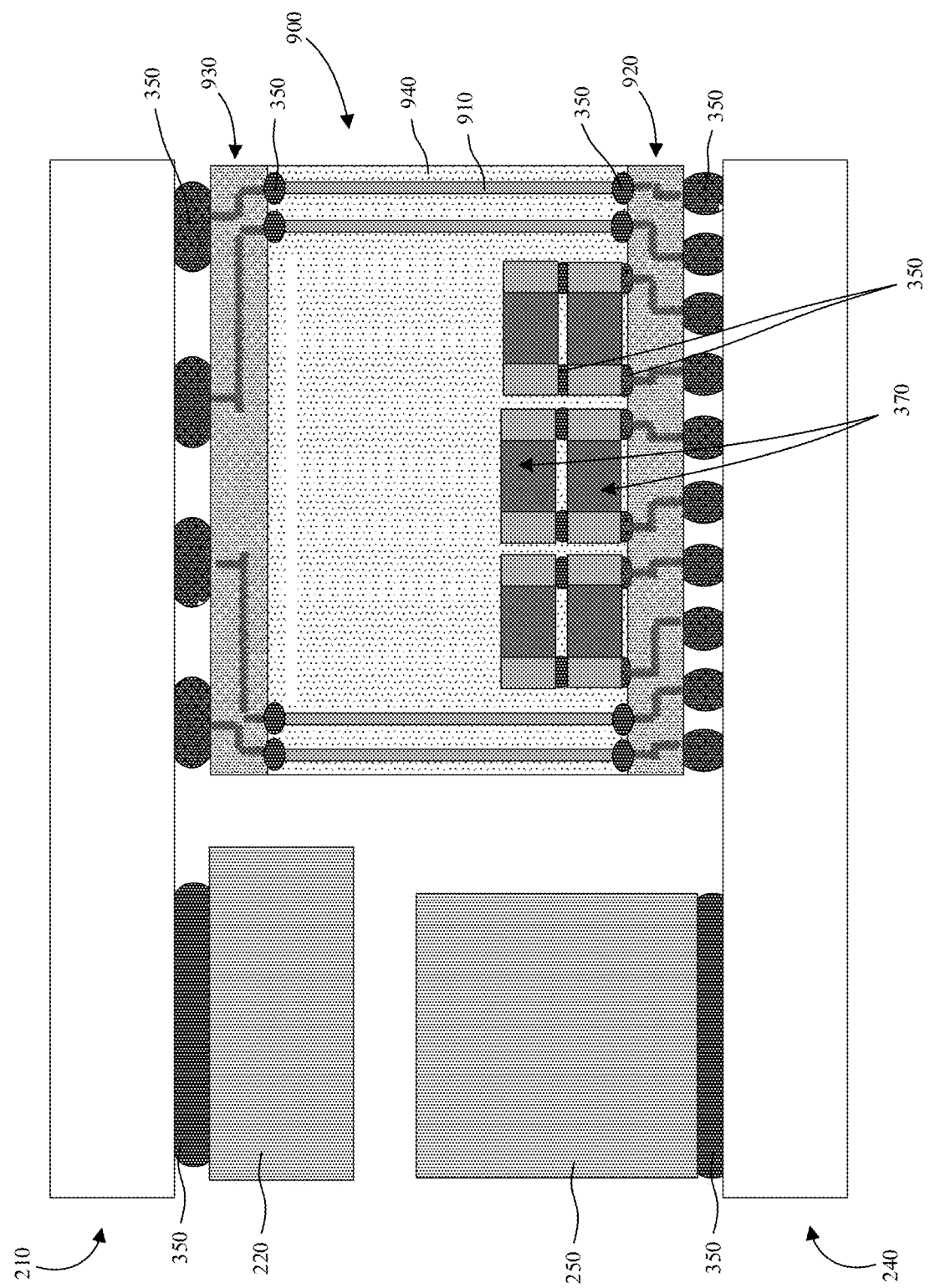
FIG. 10 is a schematic cross-sectional side view of an interposer with embedded devices and solder tall pillars in accordance with an embodiment.

Referring now to FIGS. 9-10 schematic cross-sectional side view illustrations are provided of an interposer with embedded devices and tall pillars in accordance with embodiments. In both embodiments, the interposer 900 includes a molding compound 940 that encapsulates the plurality of horizontal devices 370 and the plurality of vertical interconnects 370. The vertical interconnects 370 may be much taller than a single horizontal device 370, or multiple stacked horizontal devices 370. For example, the vertical interconnects 910 may be pillars or vertical pins. In an embodiment, the vertical interconnect 910 pillars are formed by plating onto RDL 920, as illustrated in FIG. 9. In such an embodiment, RDL 920 may be bonded to the second circuit board 240 with solder bumps of finer pitch, than solder bumps 350 used to bond top side routing 330 to the first circuit board 210. Top side routing 330 may be used to fan out connections to the vertical interconnects 910. In the embodiment illustrated in FIG. 10, the plurality of pillars 910 are solder bonded between top and bottom RDLs 930, 920, which are also solder bonded to the corresponding circuit boards 210, 240. For example, the vertical interconnects 910 may be vertical pins.

The vertical interconnects described and illustrated with regard to FIGS. 1-10 have been described as being formed of a variety of conductive structures such as vias, pillars and pins. In accordance with embodiments in which the vertical interconnects are vertical pins, they may be integrated using a technique such as TCB. Furthermore, the vertical pins may be a part of a vertical pin array between the circuit boards. In addition, the vertical pins can be placed into any open space on the circuit boards, which provides a freedom of design. The vertical pins can both be located within interposers, or separately, which can facilitate a cost reduction, in particular with regard to material cost and waste. Also, the freedom of design can further allow for circuit board miniaturization, or more I/O.

Referring now to FIGS. 11A-16H various process flows and illustrations are provided for forming a perpendicular pin array (vertical) interconnects. It is to be appreciated, that while described and illustrated separately, that the perpendicular pin array (vertical) interconnects of FIGS. 11A-16H may be combined with various vertical devices, horizontal devices, and interposer structures described herein either as separate structures, or as the vertical interconnects.

Figure 11A:
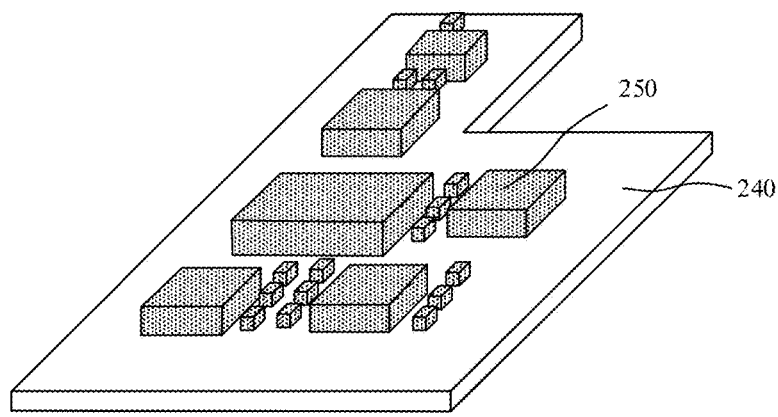
FIG. 11A-11C are isometric view illustrations of a sequence of assembling a stacked circuit board structure with a perpendicular pin array in accordance with an embodiment.
Figure 11B:
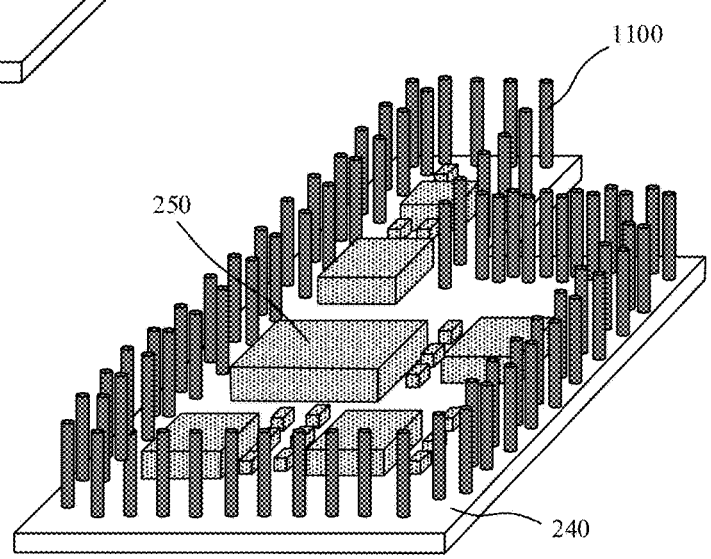
Figure 11C:
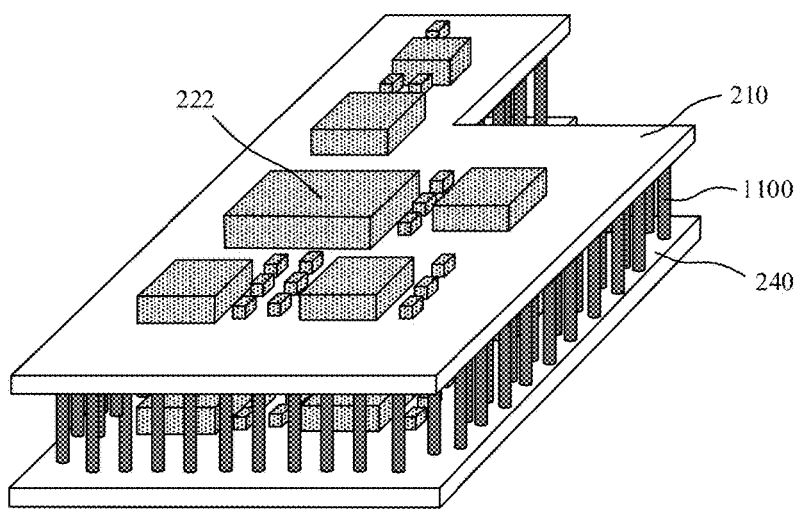

FIG. 11A-11C are isometric view illustrations of a sequence of assembling a stacked circuit board structure with a perpendicular pin array in accordance with an embodiment. As illustrated in FIG. 11A, the sequence may begin with a plurality of components 250 mounted on a circuit board 240. A plurality of vertical pins 1100 is then mounted onto the circuit board 240 laterally adjacent to the plurality of components 250. As shown in FIG. 11B, the vertical pins 1100 may be taller than the plurality of components 250. Circuit board 210 may then be mounted onto the vertical pins 1100 as illustrated in FIG. 11C. Alternatively, the circuit board 240 including the vertical pins 1100 may be stacked onto the circuit board 210. The resulting structure may resemble that of FIG. 2B, here instead the circuit boards 240, 210 are separated by the vertical pins 1100 as opposed to the stacked interposers.

Figure 12:
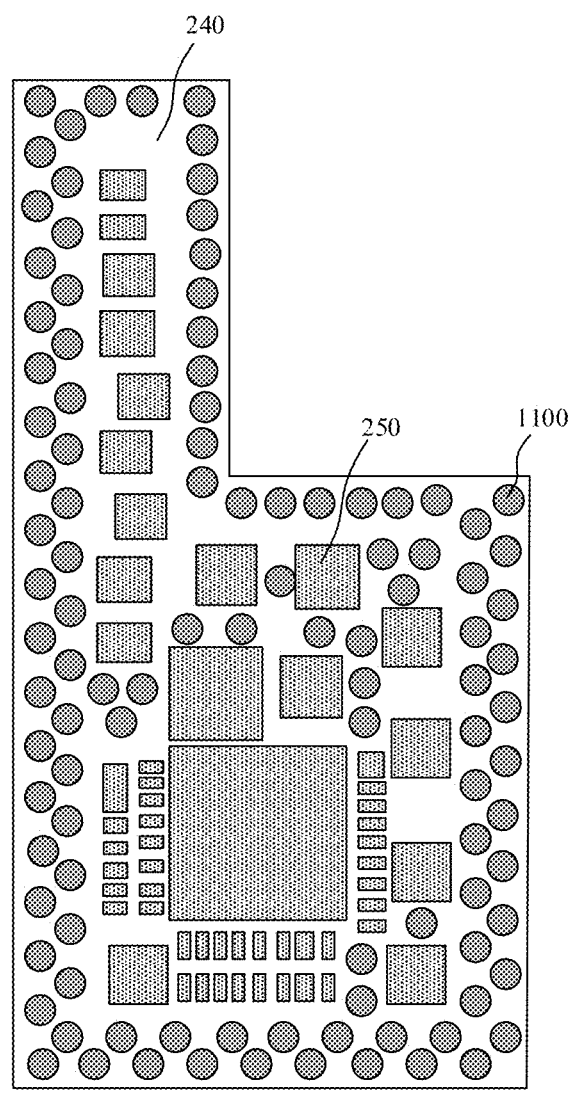
FIG. 12 is a schematic top layout view of circuit board components and a perpendicular pin array on a circuit board in accordance with embodiments.

FIG. 12 is a schematic top layout view of circuit board components and a perpendicular pin array on a circuit board in accordance with embodiments. In interest of clarity, the schematic top layout view of FIG. 12 is made with regard to the components 250 and vertical pins 1100 relative to a single circuit board 240 within the circuit board stack. As illustrated, the vertical pins 1100 can be placed at any open place, including between components, along the perimeter of the circuit board 240, or around the perimeter of one or more components 250.

Figure 13:
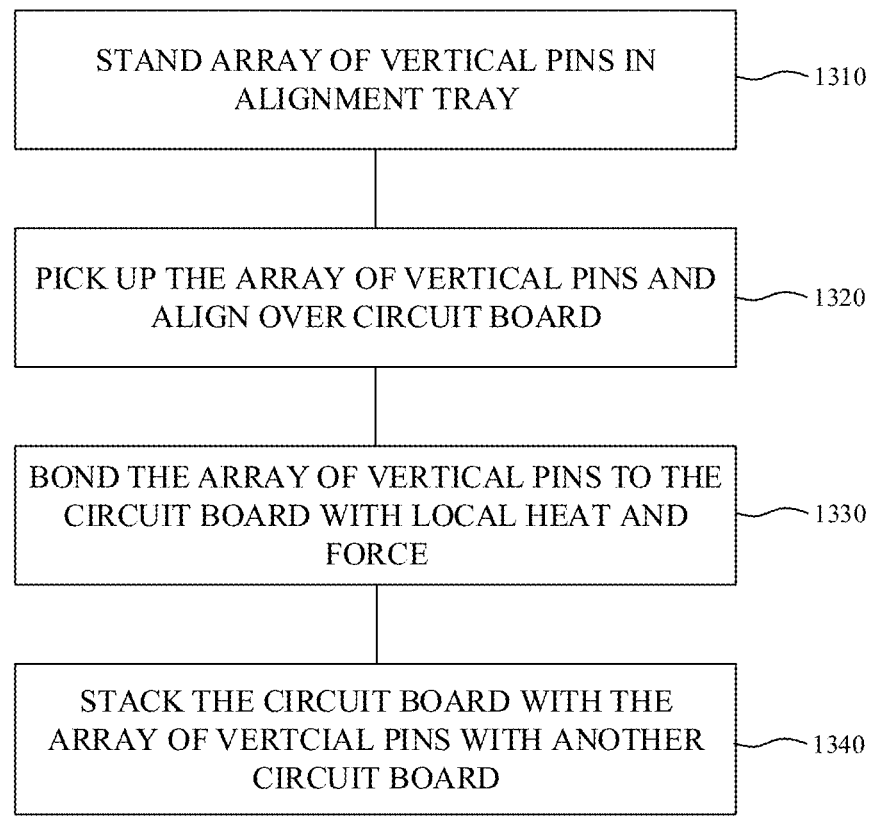
FIG. 13 is a flow chart illustrating a method of assembling a stacked circuit board structure with a perpendicular pin array in accordance with an embodiment.

Referring now to FIG. 13 and FIGS. 14A-14D, FIG. 13 is a flow chart illustrating a method of assembling a stacked circuit board structure with a perpendicular pin array in accordance with an embodiment; FIG. 14A-14D are schematic cross-sectional side view illustrations of the method of FIG. 13. In interests of clarity and conciseness, the flow chart of FIG. 13 is described with regard to the sequence illustrated in FIGS. 14A-14D.

Figure 14A:
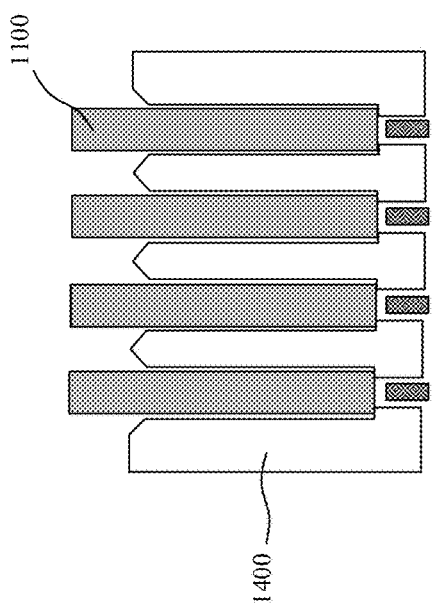
FIGS. 14A-14D are schematic cross-sectional side view illustrations of the method of FIG. 13 in accordance with an embodiment.
Figure 14C:
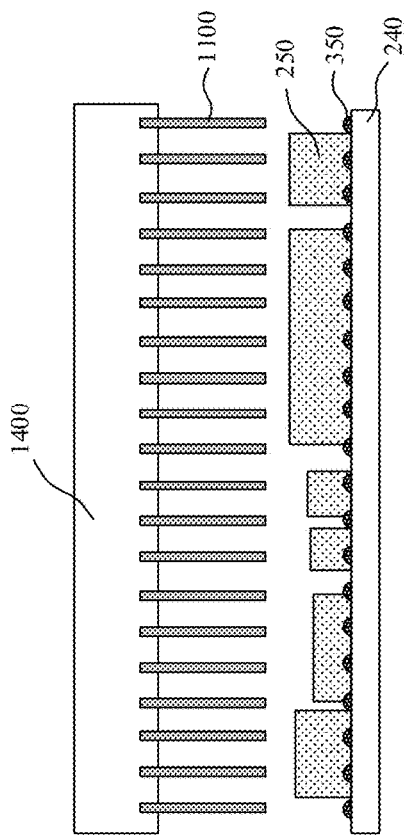
Figure 14B:
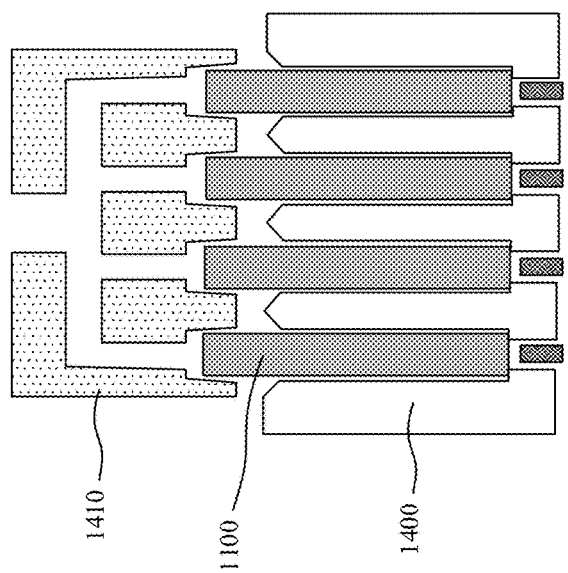
Figure 14D:
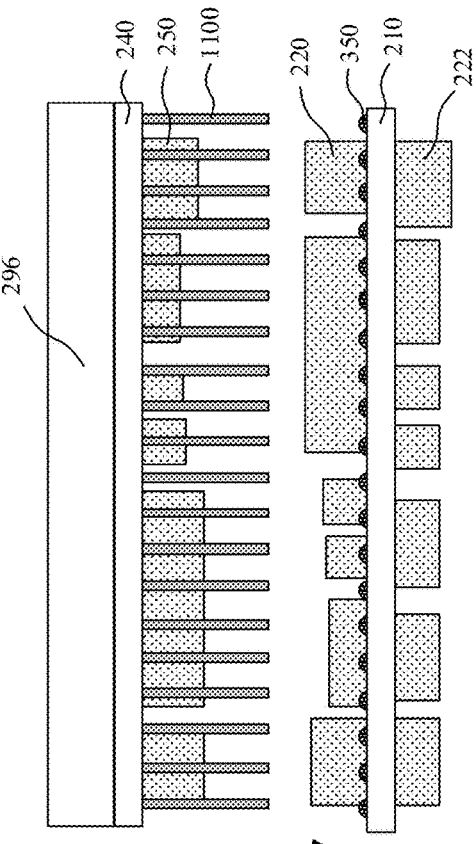

At operation 1310 an array of vertical pins is stood in an alignment tray. In particular, this may be accomplished by shaking a plurality of vertical pins over the alignment tray, which includes an array of tapered pockets. Upon shaking, the vertical pins fall into the tapered pockets, such that each pocket includes a vertical pin. FIG. 14A is a schematic cross-sectional side view illustration of a plurality of vertical pins 1100 stood in a corresponding plurality of tapered pockets in an alignment tray 1400. At operation 1320, the array of vertical pins 1100 is then picked up from the alignment tray 1400 and aligned over a target circuit board. As illustrated in FIG. 14B, the array of vertical pins 1100 can be picked up with bonding head 1410, for example, using vacuum (or other force). Referring to FIG. 14C, the array of vertical pins 1100 is aligned over the target circuit board 240. As described with regard to FIGS. 11A-11B, the circuit board 240 may already be populated with a plurality of components 250. In accordance with embodiments, the circuit board 240 is additionally populated with an array of solder bumps 350 for bonding of the array of vertical pins 1100.

At operation 1330 the array of vertical pins is bonded to the circuit board with local heat and force (e.g. thermocompression bonding). For example, the bonding operation may be performed with the bonding head 1410, in which the array of vertical pins is gang bonded, using the same transfer head 1410, which may also transfer the local heat. At operation 1340, the circuit board with the array of vertical pins 1100 is stacked with another circuit board with heat and force. In the exemplary embodiment illustrated in FIG. 14D, the circuit board 240 including the array of vertical pins 1100 is flipped, and using a transfer head 296 (e.g. TCB transfer head) the array of vertical pins 1100 is bonded with an array of solder bumps 350 on circuit board 210, which may be pre-populated with a plurality of components 220, and optionally components 222 on a back side. A molding compound 295 may then optionally be filled between the circuit boards as previously described with regard to FIG. 2D.

A stacked circuit board structure in accordance with some embodiments may include a first circuit board 210 having a first side 212 and a second side 214 opposite the first side. A first plurality of components 220 is placed on the second side 241 of the first circuit board. The stacked circuit board structure additionally includes a second circuit board 240 having a first side 242 and a second side 244 opposite the first side, where the first side 242 of the second circuit board 240 faces the second side 214 of the first circuit board 210, and where a second plurality of components 250 is placed on the first side 242 of the second circuit board 240. In an embodiment, a plurality of vertical pins 1100, each of a same height, serve as electrical interconnections between the first circuit board 210 and the second circuit board 240.

A plurality of vertical devices 270 may optionally be arranged side-by-side with the plurality of vertical pins 1100. For example, the plurality of vertical pins 1100 is arranged with a same pitch as the plurality of vertical devices.

In an embodiment, each of the plurality of vertical pins 1100 is laterally surrounded by open space. Alternatively, the vertical pins 1100 can be molded for protection and side shielding (e.g. electromagnetic shielding) of the stacked circuit board structure. In an embodiment, each of the plurality of vertical pins 1100 and at least one of the first plurality of components 250 and the second plurality of components 220 are laterally surrounded by a single molding compound layer, similar to molding compound 295 layer of FIG. 2D. As described, each of the plurality of vertical pins 1100 is solder bonded to the second circuit board 240, and solder bonded to the first circuit board 210.

Figure 15:
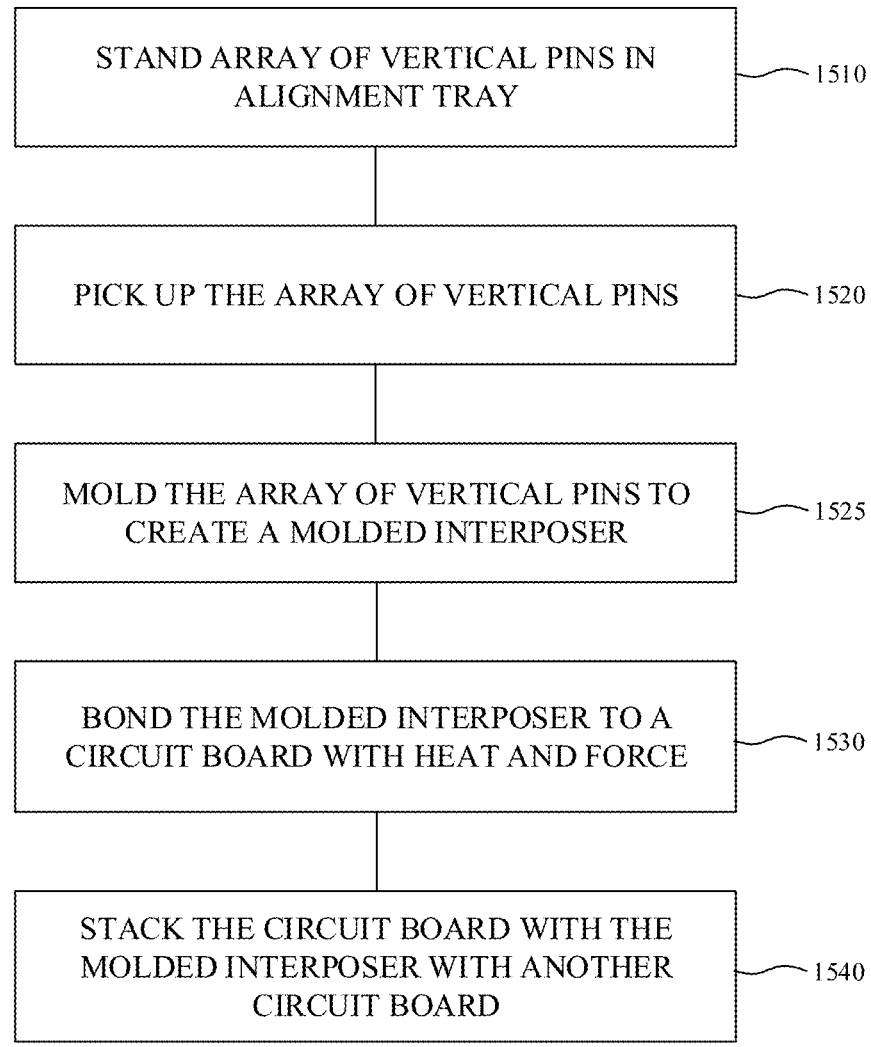
FIG. 15 is a flow chart illustrating a method of assembling a stacked circuit board structure with a molded perpendicular pin array in accordance with an embodiment.

Referring now to FIG. 15 and FIGS. 16A-16H, FIG. 15 is a flow chart illustrating a method of assembling a stacked circuit board structure with a molded perpendicular pin array in accordance with an embodiment; FIG. 16A-16H are schematic cross-sectional side view illustrations of the method of FIG. 15. In interests of clarity and conciseness, the flow chart of FIG. 15 is described with regard to the sequence illustrated in FIGS. 16A-16H.

Figure 16A:
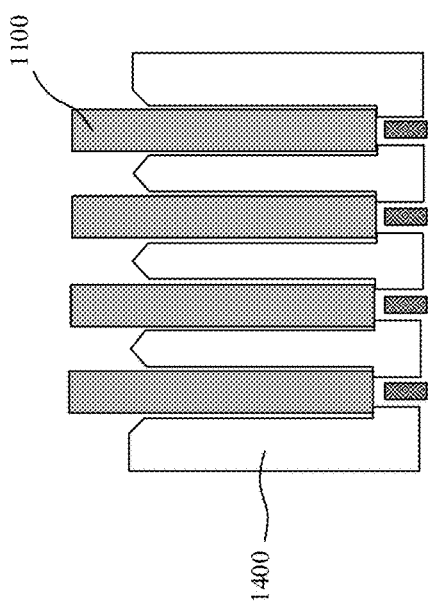
FIGS. 16A-16H are schematic cross-sectional side view illustrations of the method of FIG. 15 in accordance with an embodiment.
Figure 16B:
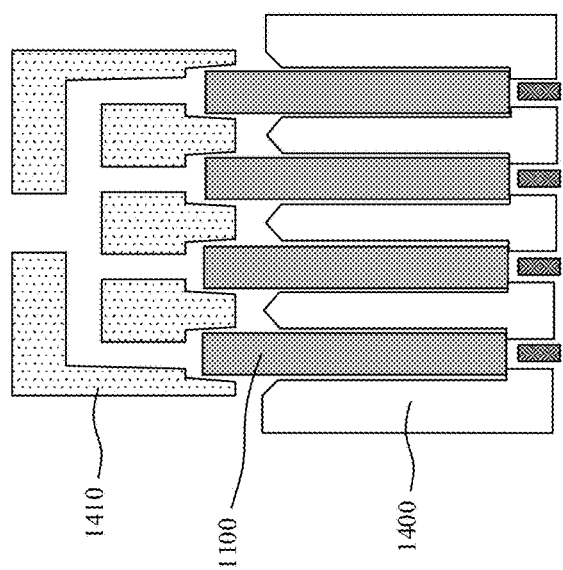

At operation 1510 an array of vertical pins is stood in an alignment tray. In particular, this may be accomplished by shaking a plurality of vertical ins over the alignment tray, which includes an array of tapered pockets. Upon shaking, the vertical pins fall into the tapered pockets, such that each pocket includes a vertical pin. FIG. 16A is a schematic cross-sectional side view illustration of a plurality of vertical pins 1100 stood in a corresponding plurality of tapered pockets in an alignment tray 1400. At operation 1520, the array of vertical pins 1100 is then picked up from the alignment tray 1400. As illustrated in FIG. 16B, the array of vertical pins 1100 can be picked up with bonding head 1410, for example, using vacuum (or other force).

Figure 16C:
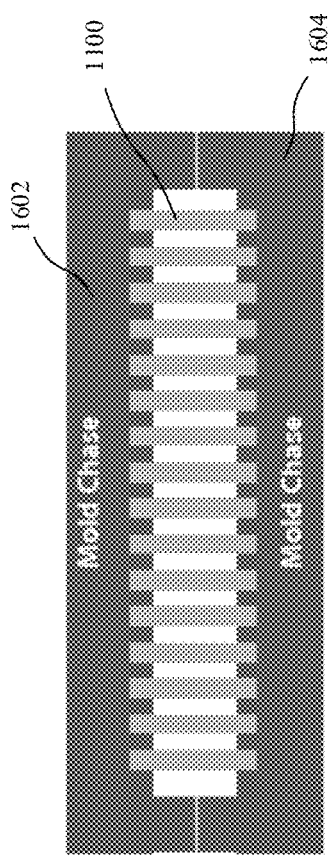
Figure 16D:
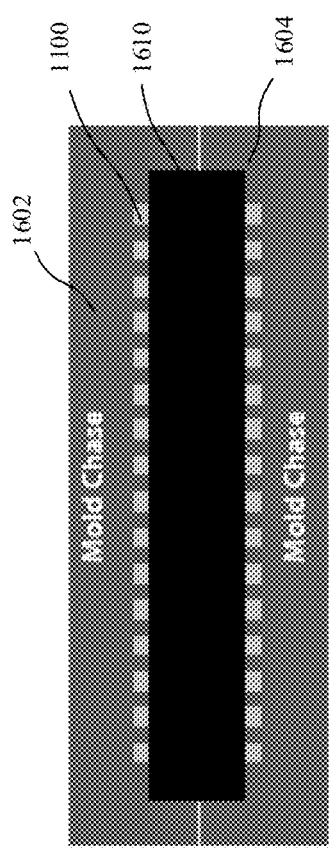
Figure 16E:
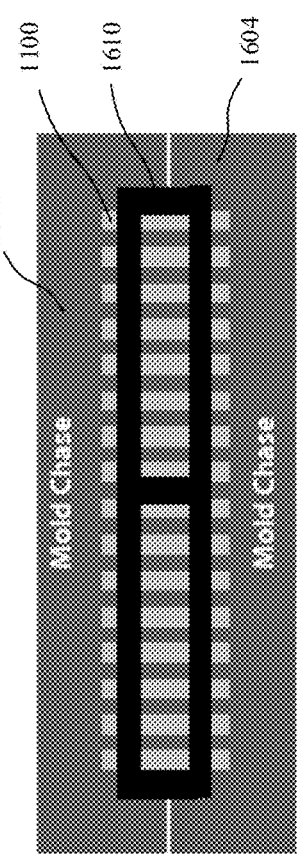

At operation 1525 the array of vertical pins is molded to create a molded interposer. Referring to FIG. 16C, this may be accomplished by arranging the array of vertical pins 1100 in an upper mold chase 1602 and lower mold chase 1604, and filling with a molding compound. FIG. 16D illustrates an embodiment in which a bulk molding compound 1610 block laterally surrounds the entire lengths of the interior portions for each of the array of vertical pins 1100. FIG. 16D illustrates an embodiment in which a molding compound 1610 pattern laterally surrounds portions of at least one length for each of the array of vertical pins 1100. A variety of molded patterns are possible to form the molded interposer, which includes the array of vertical pins 1100 that are now bound together.

Figure 16F:
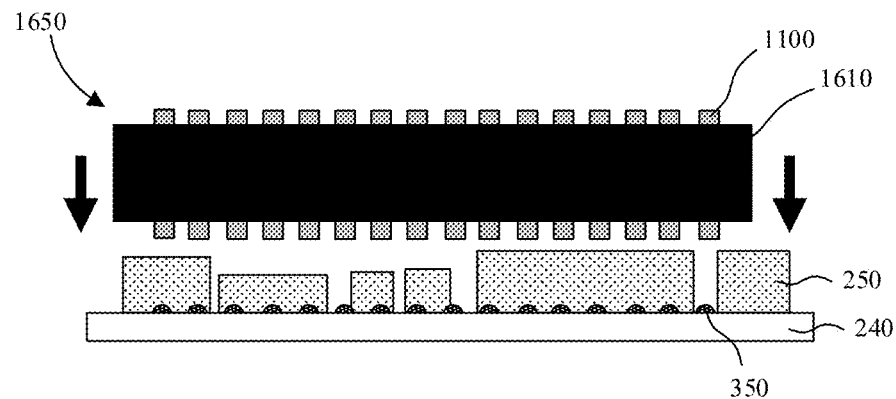
Figure 16G:
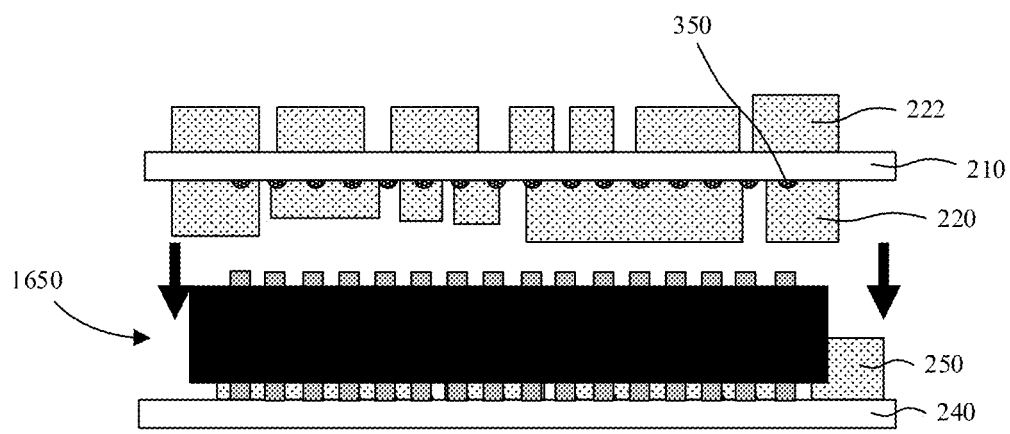
Figure 16H:
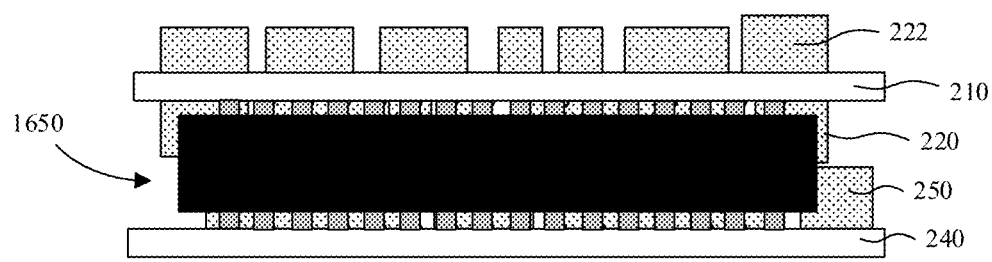

Referring to FIG. 16F, the molded interposer 1650 including the molded array of vertical pins 1100 is aligned over the target circuit board 240. As described with regard to FIGS. 11A-11B, the circuit board 240 may already be populated with a plurality of components 250. In accordance with embodiments, the circuit board 240 is additionally populated with an array of solder bumps 350 for bonding of the array of vertical pins 1100.

At operation 1530 molded interposer 1650 including the array of vertical pins is bonded to the circuit board with local heat and force (e.g. thermocompression bonding). For example, the bonding operation may be performed with the bonding head 1410 which may also transfer the local heat. At operation 1540, the circuit board with the array of vertical pins 1100 is stacked with another circuit board with heat and force. In the exemplary embodiment illustrated in FIGS. 16G-16H, circuit board 210 is pre-populated with an array of solder bumps 350, which are aligned with the array of vertical pins 1100. The circuit board 210 may additionally be pre-populated with a plurality of components 220, and optionally components 222 on a back side. The array of vertical pins 1100 is bonded with an array of solder bumps 350 on circuit board 210. In the illustrated embodiment, the molding compound 1610 connects the plurality of vertical pins 1100 as a discrete unit (interposer) between the first circuit board 210 and the second circuit board 240. A molding compound 295 may then optionally be filled between the circuit boards as previously described with regard to FIG. 2D.

In the above processing sequences two process flows were described for integrating a plurality of vertical pins 1100. In other embodiments, the pin arrangement and bonding process may be repeated for additional vertical devices 270. For example, separate alignment and bonding processes may be performed for aligning of vertical devices 270 along with the vertical pins 1100.

Figure 17:
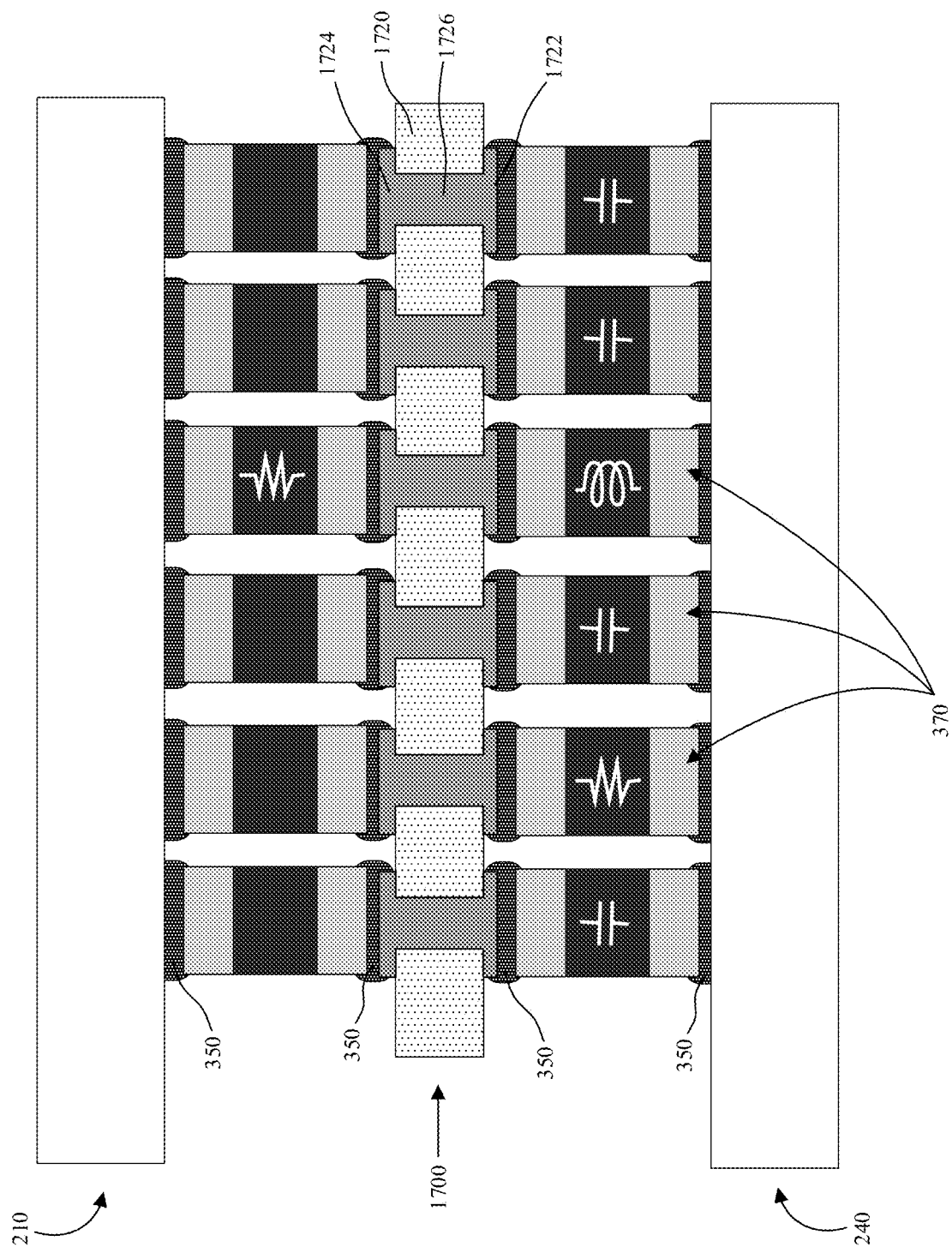
FIG. 17 is a schematic cross-sectional side view illustration of vertical passive devices mounted between two circuit boards in accordance with an embodiment.

Referring now FIG. 17, a schematic cross-sectional side view illustration is provided of vertical passive devices 370 mounted between two circuit boards in accordance with an embodiment. In particular, FIG. 17 may be a vertical passive module and may be similar in many regards to the embodiment described and illustrated with regard to FIG. 3. Similarly, any of the vertical passive devices 370 may be "dummy" devices, or may be replaced with a vertical interconnect, either of which being side-by-side with the plurality of vertical devices 370. Furthermore, the "dummy" devices or vertical interconnects may be arranged with the same pitch as the plurality of vertical devices, and may have the same size and shape as the plurality of vertical devices. For example, the vertical interconnects may be vertical pins 1100.

In the embodiment illustrated in FIG. 17, each of the plurality of vertical devices 370 (and optionally each of the plurality of vertical interconnects, or dummy devices) is laterally surrounded by open space. Alternatively, as described with regard to FIG. 2D, the open space may be filled with a molding compound. In an embodiment, each of the plurality of vertical devices 370 (and optionally each of the plurality of vertical interconnects) and at least one of the first plurality of components 220 and the second plurality of components 250 are laterally surrounded by a single molding compound 295 layer.

Still referring to FIG. 17, in the illustrated embodiment, a first group of vertical devices 370 is bonded to the first circuit board 210, and a second group of vertical devices 370 is bonded to the second circuit board 240, where the first group of vertical device is stacked on top of the second group of vertical devices. For example, the vertical devices 370 may be solder bonded to the circuit boards. In the particular embodiment illustrated, a height adjuster board 1700 is bonded between the first group of vertical devices and the second group of vertical devices, for example, with solder bumps 350. The height adjuster board may be formed of a variety of materials. For example, height adjuster board 1700 may be formed of laminate materials similar to a printed circuit board. Height adjuster board 1700 may include one or more dielectric layers 1726, vias 1720, and optional routing layers 1722, 1724.

Figure 18:
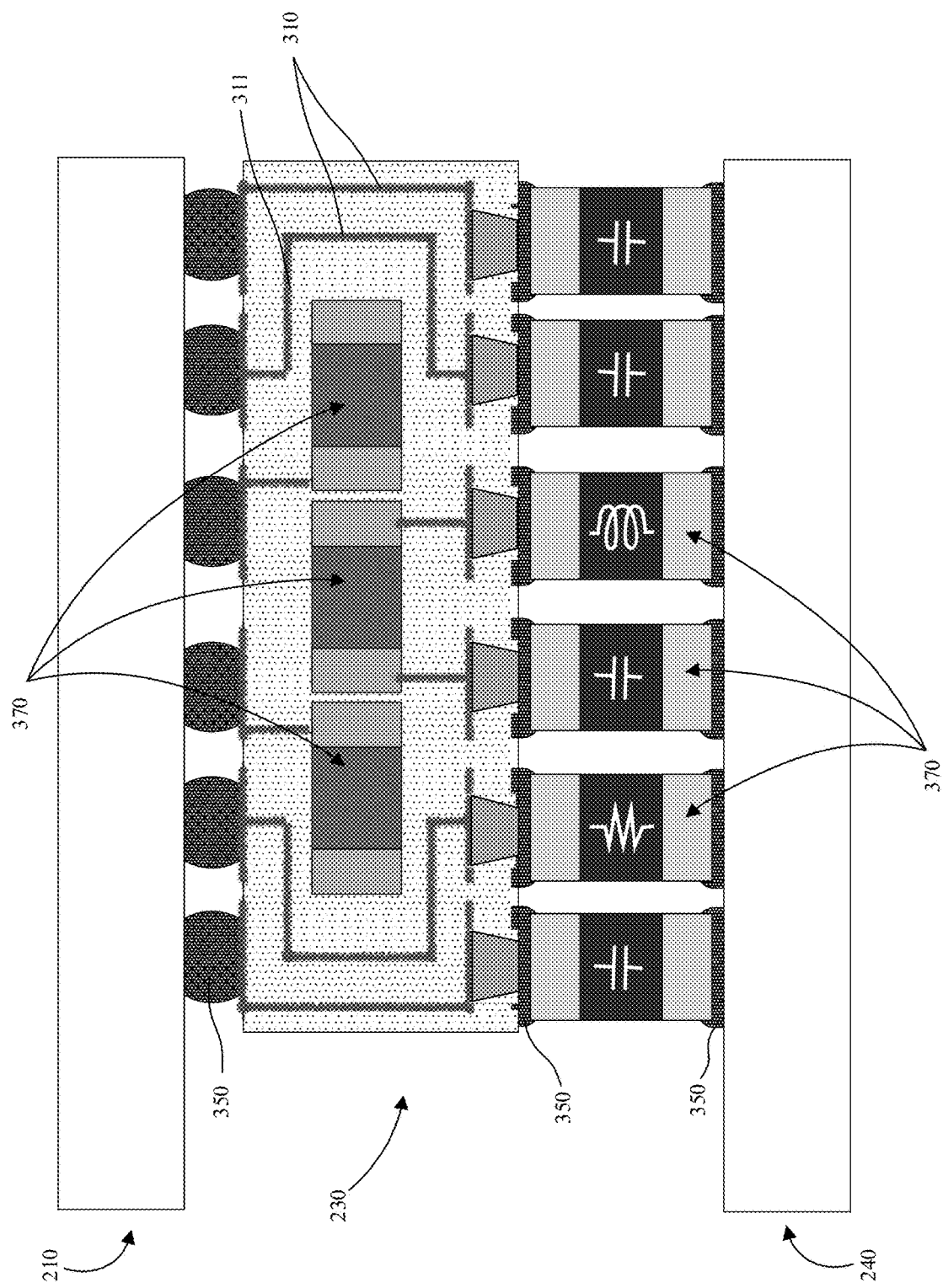
FIG. 18 is a schematic cross-sectional side view illustration of a stacked interposer and vertical passive devices mounted between two circuit boards in accordance with an embodiment.

FIG. 18 is a schematic cross-sectional side view illustration of a stacked interposer and vertical passive devices mounted between two circuit boards in accordance with an embodiment. In particular, FIG. 18 illustrates an embodiment which combines separate features of two previously described embodiments. More specifically, the illustrated embodiment integrates an interposer 230 including embedded horizontal devices 370 such as that illustrated in FIG. 5 stacked on, and bonded to a plurality of vertical devices 370, such as those illustrated in FIG. 17. As described with previous structures, the stacked structure, including any components arranged between the circuit boards 210, 240 may optionally be molded.

It is to be appreciated that while the various structural variations and processing sequences in accordance with embodiments have been described and illustrated separately, that many of the structures and processing sequences may be combined. In utilizing the various aspects of the embodiments, it would become apparent to one skilled in the art that combinations or variations of the above embodiments are possible for forming a stacked circuit board structure. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A stacked circuit board structure comprising:
   a first circuit board having a first side and a second side opposite the first side, a first plurality of components placed on the second side of the first circuit board;
   a second circuit board having a first side and a second side opposite the first side, wherein the first side of the second circuit board faces the second side of the first circuit board, and wherein a second plurality of components is placed on the first side of the second circuit board;
   a plurality of vertical devices, each of a same height, which serve as electrical interconnections between the first circuit board and the second circuit board; and
   a plurality of vertical interconnects arranged side-by-side with the plurality of vertical devices;
   wherein each vertical device of the plurality of vertical devices has a same size and shape as each vertical interconnect of the plurality of vertical interconnects.

2. The stacked circuit board structure of claim 1, wherein the plurality of vertical interconnects is arranged with a same pitch as the plurality of vertical devices.

3. The stacked circuit board structure of claim 1, wherein each of the plurality of vertical devices and each of the plurality of vertical interconnects are laterally surrounded by open space.

4. The stacked circuit board structure of claim 1, wherein each of the plurality of vertical devices, each of the plurality of vertical interconnects and at least one of the first plurality of components and the second plurality of components are laterally surrounded by a single molding compound layer.

5. The stacked circuit board structure of claim 1, wherein the plurality of vertical interconnects is a plurality of vertical pins.

6. The stacked circuit board structure of claim 1, wherein the plurality of stacked vertical devices is a second group of vertical devices bonded to the second circuit board, and further comprising a first group of vertical devices stacked on top of the second group of vertical devices and bonded to the first circuit board.

7. The stacked circuit board structure of claim 6, further comprising a height adjuster board bonded between the first group of vertical devices and the second group of vertical devices.

8. The stacked circuit board structure of claim 1, wherein each vertical device includes a solder bonded top terminal and a solder bonded bottom terminal.

9. A stacked circuit board structure comprising:
   a first circuit board having a first side and a second side opposite the first side, a first plurality of components placed on the second side of the first circuit board;
   a second circuit board having a first side and a second side opposite the first side, wherein the first side of the second circuit board faces the second side of the first circuit board, and wherein a second plurality of components is placed on the first side of the second circuit board; and
   a plurality of vertical devices, each of a same height, which serve as electrical interconnections between the first circuit board and the second circuit board;
   wherein the plurality of vertical devices is part of an interposer between the first circuit board and the second circuit board, the interposer further including a plurality of vertical interconnects and one or more insulating layers laterally surrounding both the plurality of vertical devices and the plurality of vertical interconnects.

10. The stacked circuit board structure of claim 9, wherein the plurality of vertical devices is arranged side-by-side with the plurality of vertical interconnects.

11. The stacked circuit board structure of claim 10, wherein each vertical device of the plurality of vertical devices is arranged with a same pitch as each vertical interconnect of the plurality of vertical interconnects, and each vertical device of the plurality of vertical devices has a same size and shape as each vertical interconnect of the plurality of vertical interconnects.

12. The stacked circuit board structure of claim 10, further comprising a gap between the first circuit board and the second circuit board, and a molding compound that fills the gap between the first circuit board and the second circuit board and laterally surrounds the interposer.

13. The stacked circuit board structure of claim 10, further comprising a gap between the first circuit board and the second circuit board, wherein open space fills the gap between the first circuit board and the second circuit board and laterally surrounds the interposer.

14. The stacked circuit board structure of claim 10, wherein the plurality of vertical interconnects is a plurality of vertical pins.

15. The stacked circuit board structure of claim 10, wherein the interposer is a first interposer bonded to the second side of first circuit board, and further comprising a second interposer bonded to the first side of the second circuit board, wherein the first interposer is stacked on top of the second interposer, and the first and second interposers electrically connect the first circuit board to the second circuit board.

16. The stacked circuit board structure of claim 15, wherein the second interposer component comprises:
- a second plurality of vertical devices, each of a same height, which serve as electrical interconnections between the first circuit board and the second circuit board; and
- a second plurality of vertical interconnects;
- wherein the second plurality of vertical devices is arranged side-by-side with the second plurality of vertical interconnects.

* * * * *